(12) United States Patent
Terai et al.

(10) Patent No.: US 6,281,672 B1
(45) Date of Patent: *Aug. 28, 2001

(54) OPTICAL CURRENT TRANSFORMER

(75) Inventors: Kiyohisa Terai, Yokohama; Masao Takahashi, Fujisawa; Sakae Ikuta, Tokyo, all of (JP)

(73) Assignee: Kabushiki Kaisha Toshiba, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/921,083

(22) Filed: Aug. 29, 1997

(30) Foreign Application Priority Data

Aug. 30, 1996 (JP) .................................... 8-229837

(51) Int. Cl.⁷ ............................. G01R 31/00; G01R 33/00
(52) U.S. Cl. ......................................... 324/96; 324/117 R
(58) Field of Search .................................. 324/96, 117 R

(56) References Cited

U.S. PATENT DOCUMENTS

| | | | |
|---|---|---|---|
| 3,605,013 | * | 9/1971 | Shogo ........................ 324/96 |
| 3,746,983 | | 7/1973 | Renz ......................... 324/96 |
| 3,810,013 | * | 5/1974 | Muller ....................... 324/96 |
| 3,936,742 | * | 2/1976 | Krause ....................... 324/96 |
| 4,370,612 | * | 1/1983 | Peuch et al. ................ 324/96 |
| 4,564,754 | * | 1/1986 | Sato et al. .................. 324/96 |
| 5,136,235 | * | 8/1992 | Brandle et al. .............. 324/96 |
| 5,844,410 | * | 12/1998 | Ikuta et al. ................. 324/96 |
| 5,933,238 | * | 8/1999 | Ikuta et al. ................. 324/96 |

FOREIGN PATENT DOCUMENTS

| | | |
|---|---|---|
| 43 12 184 | 10/1994 | (DE). |
| 0 537 610 | 4/1993 | (EP). |
| 2 686 423 | 7/1993 | (FR). |
| 2 245 704 | 1/1992 | (GB). |
| WO 91/01501 | 2/1991 | (WO). |

* cited by examiner

Primary Examiner—Safet Metjahic
Assistant Examiner—Jermele M. Hollington
(74) Attorney, Agent, or Firm—Oblon, Spivak, McClelland, Maier & Neustadt, P.C.

(57) ABSTRACT

An optical current transformer includes a sensor arranged adjacent to a conductor through which an electric current is to be measured flows, a light source for generating a measuring light, a detector for detecting the measuring light emitted from the sensor, a coupling optical system for optically connecting the sensor, the light source and the detector, and a signal processing system for processing a signal transmitted from the detector so as to calculate the electric current flowed through the conductor by using a Faraday effect of light which passes through the sensor. The sensor is formed by an optical fiber, the optical fiber being wound around the conductor, and the two ends of the optical fiber being arranged to form a closed loop of the optical fiber.

72 Claims, 11 Drawing Sheets

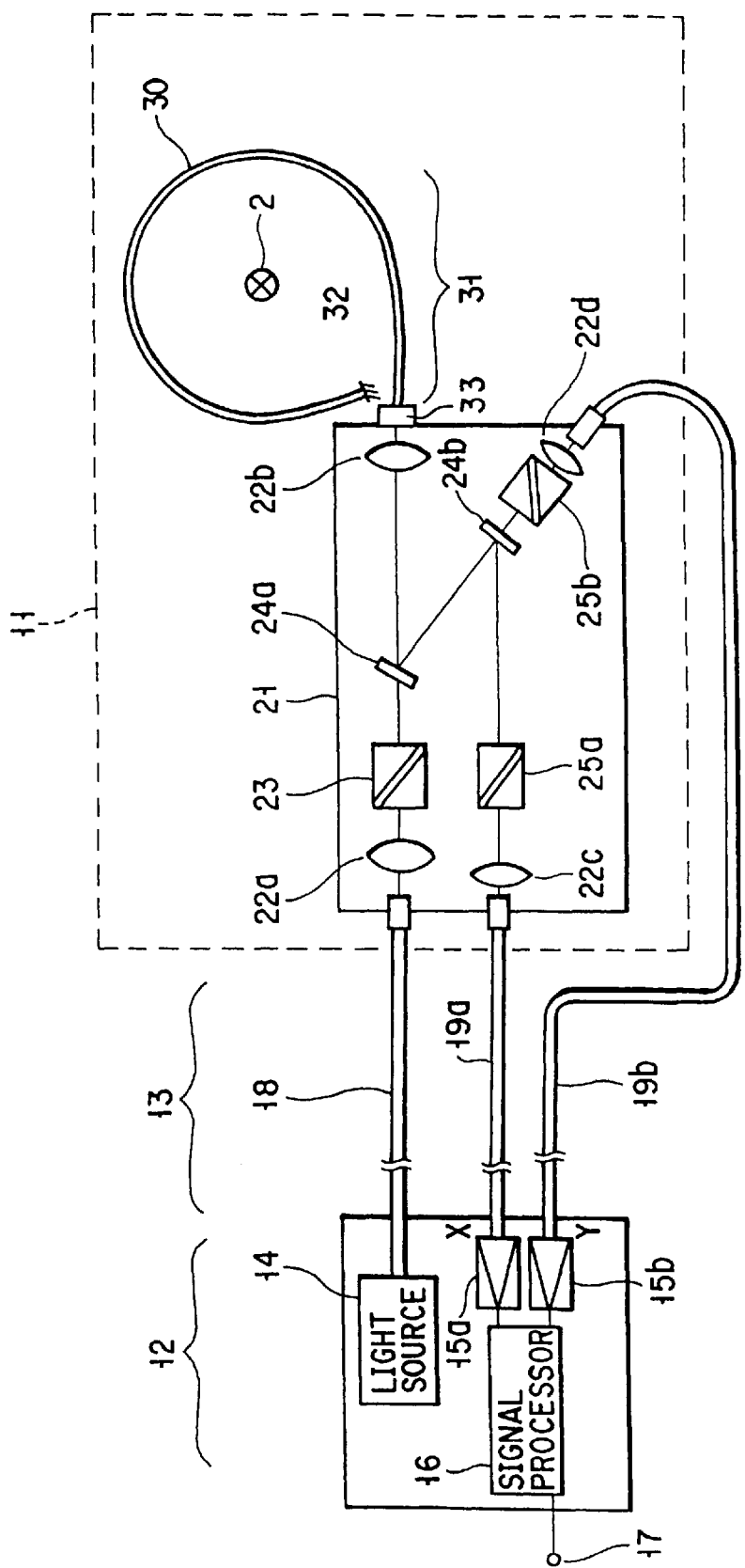
F I G. 2

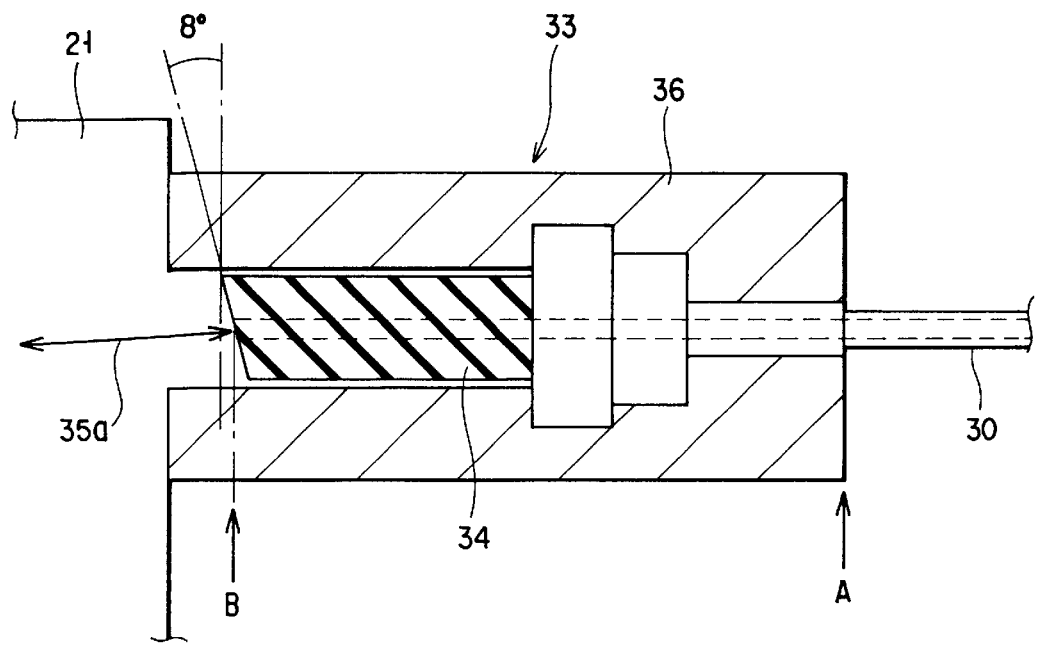
F I G. 4
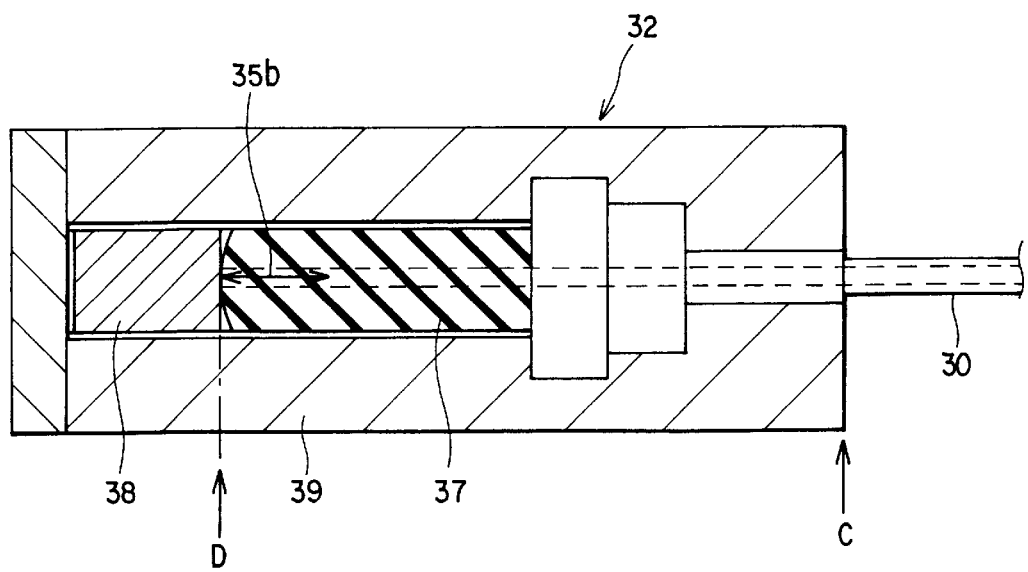
F I G. 5

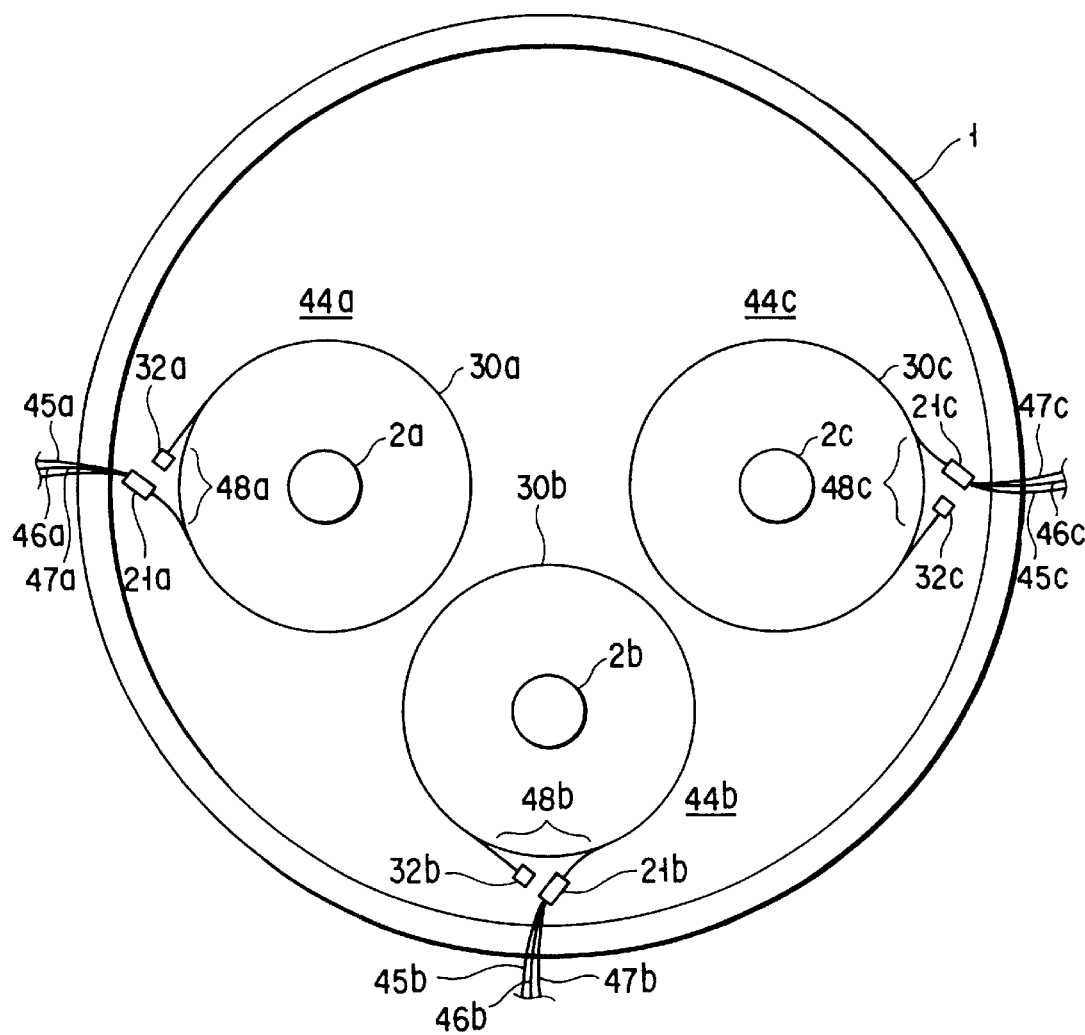
F I G. 11

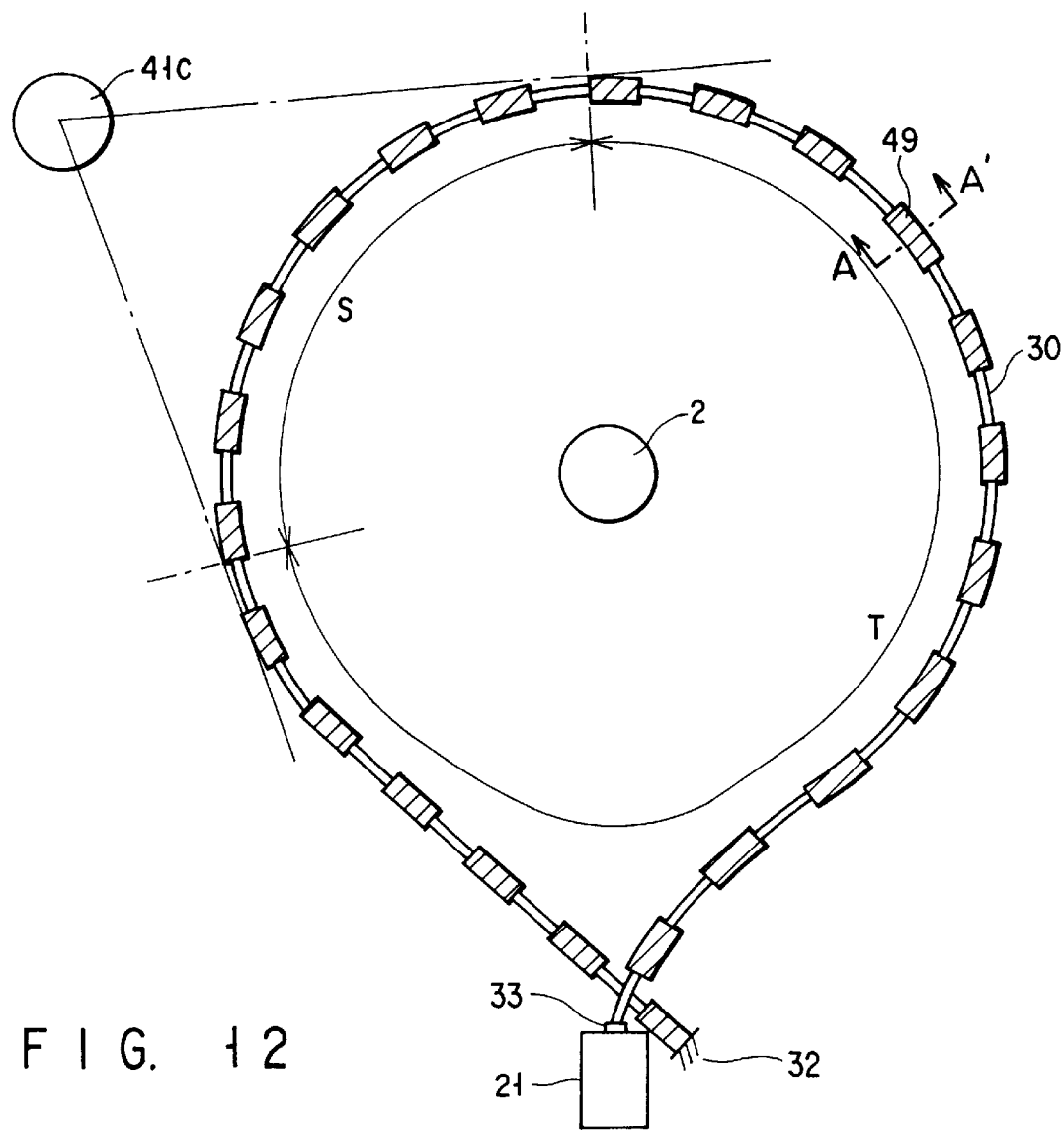
F I G. 12
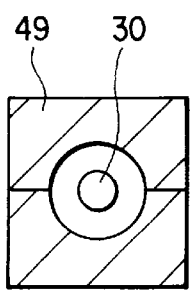
F I G. 13A
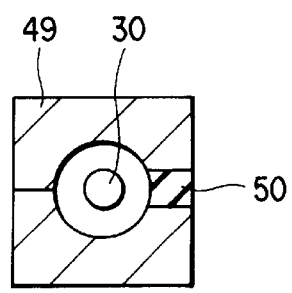
F I G. 13B

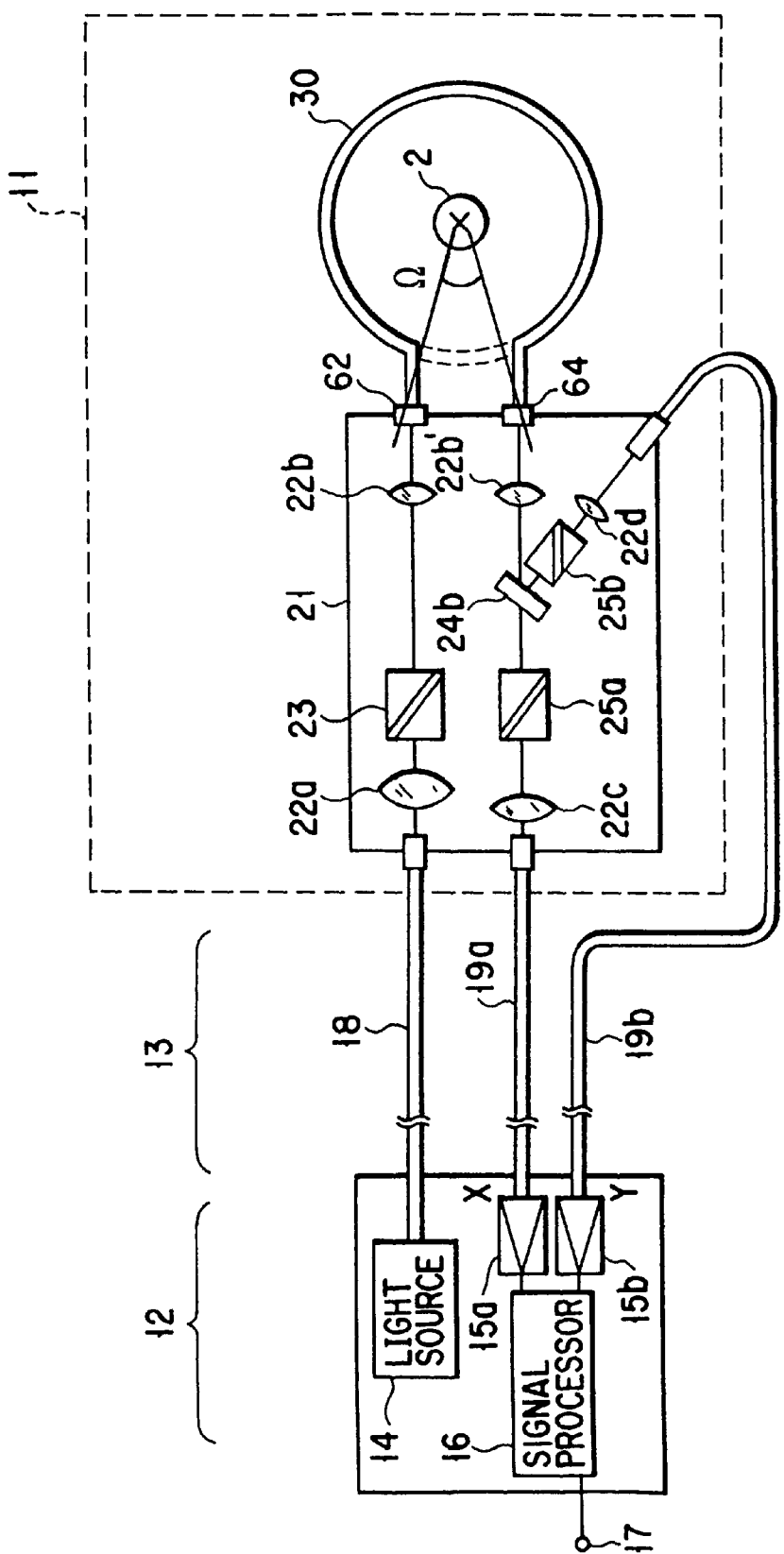
F I G. 15

OPTICAL CURRENT TRANSFORMER

BACKGROUND OF THE INVENTION

The present invention relates to an optical current transformer to measure an electric current using Faraday effect of light, and more particularly to an optical current transformer which is capable of accurately measuring an electric current without influence of an external electric current except for the electric current which is to be measured or capable of measuring a large electric current.

This application is based on Japanese Patent Application No. 8-229837, filed Aug. 30, 1996, the content of which is incorporated herein by reference.

Hitherto, an apparatus of a type using light, that is an optical current transformer has been developed to measure an electric current for a power transmission and substation system. The optical current transformer is arranged in such a way that a block made of lead glass or the like to serve as a sensor is disposed adjacent to a conductor through which an electric current to be measured flows. Moreover, linearly polarized light is allowed to pass through the sensor to measure the angle of rotation of the Faraday effect generated because of a magnetic field created by the electric current. An example of the conventional optical current transformer is shown in FIG. 1.

FIG. 1 shows an example of an optical current transformer for a gas insulated switchgear. As shown in FIG. 1, a conductor 2 allowing a high voltage electric current to flow therein is included in a tank 1, the voltage of which is the ground potential. The conductor 2 permits an electric current to flow in a direction perpendicular to the drawing sheet. A block-shape sensor 3 made of lead glass or the like is disposed to surround the conductor 2, the sensor 3 being fixed by a fixing member 4. To enable the conductor 2 to permit a high voltage electric current to flow, the fixing member 4 of the sensor 3 is attached to the tank 1 through an insulating pipe 5 so that the fixing member 4 of the sensor 3 is insulated from the tank 1. A box 6 including an optical system is attached below the tank 1. The box 6 includes an coupling optical system 7, a light transmitting fiber 8 and two light receiving fibers 9a and 9b.

The coupling optical system 7 comprises a lens 7a and a polarizer 7b. The fibers 8, 9a and 9b are optically connected to the sensor 3 through the coupling optical system 7. The light transmitting fiber 8 transmits a measuring light generated by a light source (not shown) to the sensor 3 through the coupling optical system 7. The light receiving fibers 9a and 9b respectively receive light which has been, by the coupling optical system 7, divided into components linearly polarized into two directions perpendicular to each other to transmit the light components to a signal processing system (not shown).

The optical current transformer having the above-mentioned structure shown in FIG. 1 is able to measure an electric current which flows in the conductor 2 in accordance with the following principle.

Initially, light emitted from the light source (not shown) is allowed to pass through the light transmitting fiber 8, and then introduced into the coupling optical system 7. Light is, in the coupling optical system 7, formed into a linearly polarized light 10a in the form of a substantially parallel beam to propagate through a space in the insulating pipe 5. Thus, the linearly polarized light 10a is incident on the sensor 3 made of the lead glass, and then circulated around the conductor 2 in such a way that the linearly polarized light 10a is reflected repeatedly in the sensor 3. Then, the linearly polarized light 10a is emitted from the sensor 3. During this propagation, the polarization plane of light which passes through the sensor 3 is rotated by an angle corresponding to the level of an electric current due to the Faraday effect induced by the electric current which flows in the conductor 2.

The light emitted from the sensor 3 is formed into a linearly polarized light 10b which propagates through the space, and then again is incident on the coupling optical system 7 so that light is divided into two components polarized linearly in the two directions perpendicular to each other and then respectively is incident on the two light receiving fibers 9a and 9b.

Hereinafter, the light which is emitted from the polarizer 7b and transmitted to the light receiving fiber 9a or 9b through the sensor 3 is called the polarized measuring light. In FIG. 1, the polarized measuring light includes the linearly polarized light 10a, the light transmitted in the sensor 3, and the linearly polarized light 10b. The incident light in the form of the two components is processed by the signal processing system so that the angle of rotation, that is, the level of the electric current which flows in the conductor 2 is measured. Since the members and operations of the coupling optical system 7 and the signal processing system are known facts, they are omitted from detailed descriptions.

The apparatus for measuring an electric current for the power transmission and substation system must satisfy the following requirements:

(1) The size can be reduced and the structure can be simplified.
(2) The apparatus is able to always precisely measure the electric current without influence from an external electric current generated by an adjacent conductor except for the conductor which is to be measured.
(3) The apparatus is also able to measure a large electric current.
(4) The cost of the apparatus must be reduced to be widely used.

However, the conventional optical current transformer shown in FIG. 1 has a problem that the optical current transformer is affected by an external electric current. Therefore, the above-mentioned optical current transformer cannot always precisely measure an electric current. The optical path in the sensor 3 of the optical current transformer shown in FIG. 1 is not formed into a complete closed loop because a surplus optical path indicated by symbol L exists. Therefore, light is, in this surplus optical path, affected by an external magnetic field created by an external electric current or the like. As a result, the electric current, which flows in the conductor 2 cannot accurately be measured. The external electric current may be a sheath current which flows in the tank 1, currents in other phases in a case where the currents in respective phases flow in respective tanks, or current which flow conductors in other phases in a case where the conductors in all phases are included in the same tank 1.

Since the sensor 3 has excellent sensitivity (because lead glass has a large Verdet constant), the conventional optical current transformer suitable to measure a small electric current. However, a large electric current cannot easily be measured.

Moreover, the conventional apparatus using the block-shape sensor 3 cannot be formed into a small and simple structure. Therefore, the cost, which is required to be reduced for the purpose of realizing wide use of the apparatus, cannot easily be reduced.

BRIEF SUMMARY OF THE INVENTION

Accordingly, it is a first object of the present invention to provide an optical current transformer having a small size, a simple structure and capable of accurately measuring an electric current.

A second object of the present invention is to provide an optical current transformer having a small size, a simple structure and capable of accurately measuring an electric current and also measuring a large electric current.

According to the present invention, there is provided an optical current transformer comprising:

a light source for generating a polarized measuring light;

an optical fiber wound around a conductor through which an electric current to be measured flows in order to circulate the measuring light around the conductor, the polarization plane of the light which propagates through the optical fiber being rotated by a magnetic field generated by the electric current; and means for detecting the level of the electric current by detecting an angle of rotation of the polarization plane of the light emitted from the optical fiber.

Therefore, the optical current transformer according to the present invention cannot easily be affected by an external magnetic field generated by an external electric current or the like. Accurate measurement can always be performed. Since the optical fiber is employed, the structure of the optical current transformer can be simplified as compared with a structure having a block. Moreover, the cost can be reduced.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 2 is a block diagram showing a first embodiment of an optical current transformer according to the present invention;

FIG. 4 is a diagram showing the detail of an incidental/emission end of the sensor;

FIG. 5 is a diagram showing the details of a reflection end of the sensor;

FIG. 11 is a diagram showing the positional relationship between a sensor and a coupling optical system according to a sixth embodiment;

FIG. 12 is a diagram showing a sensor according to a seventh embodiment;

FIGS. 13A and 13B are diagrams showing a magnetic shield according to the seventh embodiment;

FIG. 15 is a block diagram showing a modification of the first embodiment.

DETAILED DESCRIPTION OF THE INVENTION

Figure 1:
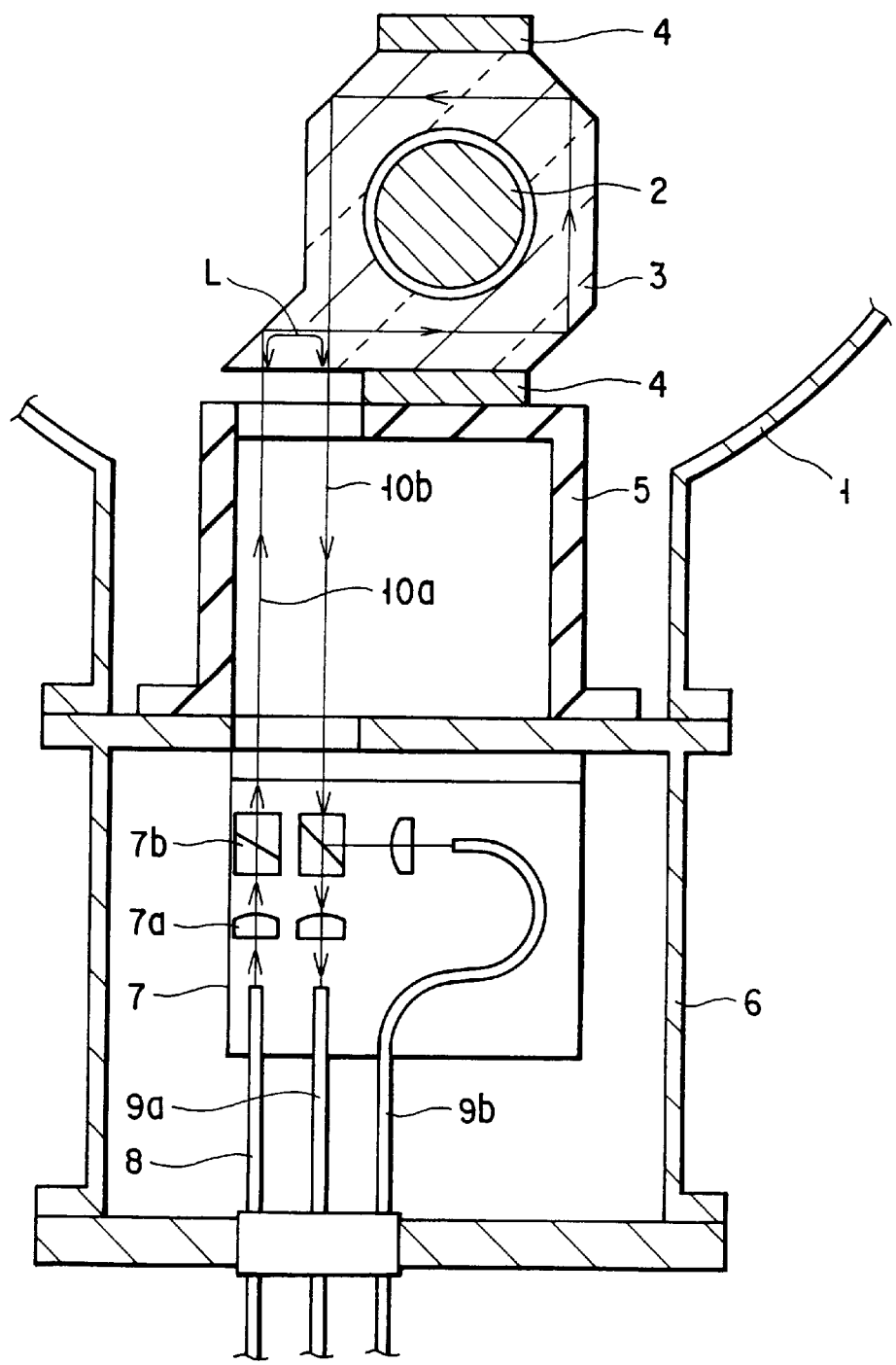
FIG. 1 is a block diagram showing a conventional optical current transformer.

A preferred embodiment of an optical current transformer according to the present invention will now be described with reference to the accompanying drawings.

First Embodiment

FIG. 2 is a block diagram showing the structure of the first embodiment. The optical current transformer according to the first embodiment comprises a sensor optical system 11, a signal processing system 12 and a transmitting fiber portion 13 for connecting the sensor optical system 11 and the signal processing system 12 to each other.

An optical fiber 30 is employed as the sensor optical system 11. The principle of the optical current transformer comprising the optical fiber to measure an electric current will now be described. If the distance for which light propagates through the optical fiber is 1, the Verdet constant of the optical fiber is V and the intensity of the magnetic field is H, faraday rotational angle θ f of the light which propagates through an optical fiber wound by n times around an electric current can be expressed as follows:

$$\theta f = n\, V \int H\, dl \qquad (1)$$

Since integration of one round of the magnetic field H is the same as electric current I because of Ampere's theorem, the Equation (1) can be transformed as follows:

$$\theta f = n\, V\, I \qquad (2)$$

Therefore, the Faraday rotational angle, that is, the value of the electric current is expressed by the following equation where linearly polarized light emitted from the optical fiber, which is the sensor, is divided into two linearly polarized lights which are perpendicular to each other for detection, and their intensities are Px and Py:

$$I = (1/nV)\sin^{-1}\{(Px-Py)/(Px+Py)\} \qquad (3)$$

The current transformer according to the present invention is based on the above-mentioned principle. As can be understood from Equation (3), the above-mentioned measuring method has an advantage that change in the output from the light source does not affect the output signal.

The signal processing system 12 comprises a light source 14 for generating a measuring light; detectors 15a and 15b for detecting two polarized lights having a polarization planes which are perpendicular to each other to convert the lights into electric signals corresponding to the intensities of the lights; a signal processing circuit 16 for processing the signals obtained by the detectors 15a and 15b in accordance with Equation (3); and an output terminal 17 for transmitting a result of the signal processing. The light source 14 comprises a laser diode or a super-luminescent diode.

The transmitting fiber portion 13 comprises light transmitting fiber 18 for transmitting light from the light source 14 in the signal processing system 12 to the sensor optical system 11; and two light receiving fibers 19a and 19b for transmitting light from the sensor optical system 11 to the two detectors 15a and 15b in the signal processing system 12.

The sensor optical system 11 comprises a coupling optical system 21 and a sensing fiber portion 31. The coupling optical system 21 comprises four lenses 22a to 22d, a polarizer 23, two beam splitters 24a and 24b and two analyzers 25a and 25b.

The four lenses 22a to 22d convert light which has propagated through the light transmitting fiber 18 into parallel beams or converge the parallel beams to incident on the light receiving fibers 19a and 19b or a sensing fiber portion 31. The polarizer 23 converts light into linearly polarized light whose polarization plane has an angle of 45° from the horizontal direction. Two beam splitters 24a and 24b divide light into transmitted light and reflected light in accordance with the incidental angle of light. Two analyzers 25a and 25b permit linearly polarized light in the horizontal direction (in x direction) and the vertical direction (in y direction) to pass through.

In FIG. 2, the light which is emitted from the polarizer 23y, transmitted to the distal end of the sensor 30, reflected by the distal end of the sensor 30, returned to the light receiving fiber 19a or 19b is the polarized measuring light.

In this case, the coupling optical system 21 transmits light from the light transmitting fiber 18 to an end of the sensing fiber portion 31 through the first lens 22a, the polarizer 23, the first beam splitter 24a and the second lens 22b. In the coupling optical system 21, reflection light from the sensing fiber portion 31 is reflected by the beam splitter 24a through the second lens 22b. The reflected light is divided into two light components in two directions by the second beam splitter 24b. The coupling optical system 21 transmits one of these light components to the light receiving fiber 19a through the first analyzer 25a and the third lens 22c. The coupling optical system 21 transmits the other light component to the light receiving fiber 19b through the second analyzer 25b and the fourth lens 22d.

On the other hand, the sensing fiber portion 31 comprises a sensor 30 having an end connected to the coupling optical system 21; and a reflection end 32 formed at an end of the sensor 30. The sensor 30 is, by the number n of times which is substantially an integer not smaller than 1, wound around a conductor 2 through which an electric current which is to be measured flows. Light which is incident from the coupling optical system 21 on an end of the optical fiber 30 propagates through the optical fiber 30, and then reflected at the reflection end 32 at the end of the optical fiber 30. Thus, reflected light is returned to the foregoing incidental end through which light is incident on the coupling optical system 21. Since the reflection end 32 is formed at the end of the sensor 30, the end of the sensor 30 serves as an incidental/emission end which serves as both of an incidental end and an emission end. Thus, light is given the Faraday effect double in the forward and return paths. Therefore, the signal processing circuit 16 calculates the current value in accordance with an equation obtained by doubling the parameter n (the number of turns) in Equation (3). Since the current value I is in inverse proportion to the number n of turns as indicated in Equation (3), the number n of turns is determined in accordance with the level of an electric current which is to be measured. That is, when a large electric current is required to be measured, n=1. When a small electric current is required to be measured, n is increased.

Note that the sensor 30 comprising the optical fiber is loosely secured to a receiving portion (not shown) formed adjacent to the conductor 2. Thus, the sensor 30 cannot easily be affected by external force. The reason for this is that addition of stress to the optical fiber must be prevented even if the receiving portion of the optical fiber is expanded or contracted because of change in the temperature or vibrated. Although the typical optical fiber for forming the sensor 30 is a silica optical fiber exhibiting excellent reliability, an optical fiber of another type may be employed.

The operation of this embodiment having the above-mentioned structure will now be described.

Light emitted from the light source 14 in the signal processing system 12 is allowed to pass through the light transmitting fiber 18, and then transmitted to the coupling optical system 21 in the sensor optical system 11. In the coupling optical system 21, light allowed to pass through the light transmitting fiber 18 is converted into parallel beams by the first lens 22a. Then, the parallel beams are, by the polarizer 23, converted into a linearly polarized light having apolarization plane which has an angle of 45° from the horizontal direction. Then, light is allowed to pass through the first beam splitter 24a, and then converged by the second lens 22b, followed by transmitting light to the sensing fiber portion 31. Thus, light is incident on the incidental/emission end of the sensor 30.

In the sensing fiber portion 31, light which is incident on the sensor 30 from the coupling optical system 21 propagates through the sensor 30, and then reflected at the reflection end 32 of the sensor 30. Then, light is returned into the sensor 30, and then light propagates in the opposite direction. Thus, light is emitted from incidental/emission end of the sensor 30. During the propagation of light, the polarization plane of light which passes through the sensor 30 in the forward and reverse directions is rotated by the Faraday effect induced by the electric current which flows through the conductor 2 and which is to be measured.

Light emitted from the sensing fiber portion 31 is incident on the coupling optical system 21 so as to be converted into parallel beams by the second lens 22b. Then, the parallel beams are reflected by the first beam splitter 24a, and divided into two light components propagating in two directions by the second beam splitter 24b.

The polarized component in x direction (the horizontal direction) of one of divided lights is extracted by the first analyzer 25a, and then transmitted to the detector 15a of the signal processing system 12 through the third lens 22c and the light receiving fiber 19a. The polarized component in y direction (the vertical direction) of the other of the divided lights is extracted by the second analyzer 25b, and then transmitted to the other detector 15b of the signal processing system 12 through the fourth lens 22d and the light receiving fiber 19b.

Lights of x and y directional polarized components are respectively transmitted to the detectors 15a and 15b, and then electric signals indicating the respective polarized components are obtained by the detectors 15a and 15b. The electric signals are transmitted to the signal processing circuit 16 so as to be subjected to a calculation process.

The signal processing circuit 16 calculates the Faraday rotational angle, that is, the value of the electric current based on the following equation using the intensities of the two polarized components Px and Py:

$$I=(\tfrac{1}{2}nV)\sin^{-1}\{(Px-Py)/(Px+Py)\} \quad (4)$$

where n is the number of windings of the optical fiber around an electric current and V is the Verdet constant of the optical fiber. Since light is reflected at the reflection end and then allowed to propagate through the same fiber, the Farady rotational angle is twice the angle in the foregoing description of the principle. Therefore, Equation (4) has a value ½ of that of Equation (3).

A result of the calculation obtained by the signal processing circuit 16, that is, a result of measurement of the electric current value is output from the output terminal 17.

Figure 3:
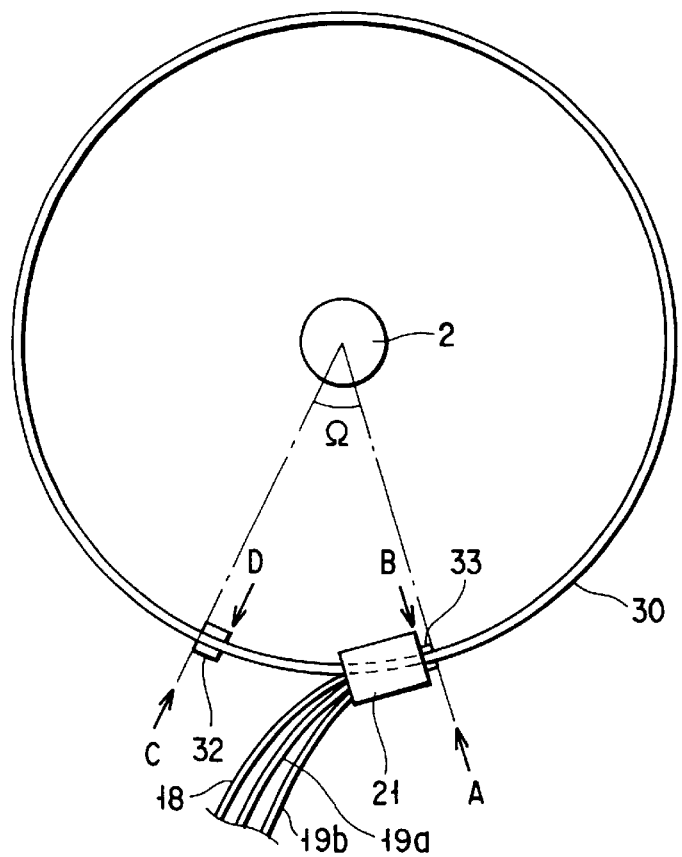
FIG. 3 is a diagram showing the positional relationship between a sensor and a coupling optical system.

FIG. 3 is a diagram showing the detailed structure of the sensor optical system 11, and more particularly the connection between the sensor 30 and the coupling optical system 21. Although the coupling optical system 21 is illustrated to have a size larger than an actual size in FIG. 2 for the sake of explanation, the size shown in FIG. 3 approximates the actual size. The sensor 30 comprising the optical fiber is wound around the conductor 2, through which the electric current which is to be measured flows, by the number n of turns which is an integer not smaller than 1. The sensor 30 forms a substantial closed loop in which the reflection end 32 and the incidental/emission end 33 connected to the coupling optical system 21 are disposed adjacent to each other. If the reflection end 32 and the incidental/emission end 33 coincide with each other, the sensor 30 forms a complete closed loop. The sensor 30 is not affected by an external magnetic field generated by an electric current other than the electric current to be measured. The degree of approximation between the reflection end 32 and the incidental/emission end 33 in this embodiment will now be described. When the sensor 30 is viewed from a plane perpendicular to the conductor 2, the perspective angle Ω obtained by viewing, from the conductor 2, a region (two end regions of the optical fiber) between substantial end position A of the incidental/emission end 33 of the sensor 30 and substantial end position C of the reflection end 32 is not more than 1% of 2 πn (radian). The reason for this is that a fact that allowance of the optical current transformer is ±1% or less must be realized by making the absolute value of the perspective angle Ω obtained by viewing the two end regions from the conductor to be 1% or less.

FIG. 4 is a diagram showing the structure of the incidental/emission end 33 of the sensor 30 shown in FIG. 3. As shown in FIG. 4, the incidental/emission end 33 of the sensor 30 is secured by a ferrule 34 which is formed of zirconia or glass. The leading end of the ferrule 34 is slanted to have an angle of 8 degrees in order to prevent return of light reflected by the end surface of the ferrule 34 to the inside portion of the coupling optical system 21 through the optical path which is the same as the incidental optical path. Reference numeral 35a shown in FIG. 4 represents an optical path between the coupling optical system 21 and the ferrule 34.

As described above, the incidental/emission end 33 of the sensor 30 secured by the ferrule 34 and the ferrule 34 are included in a member 36 made of a magnetic material, such as nickel, iron, ferrite or invar. The magnetic field in the member 36 to which the sensor 30 is exposed is reduced because of the magnetic shielding effect of the member 36. As a result, the substantial end position of the incidental/emission end 33 of the sensor 30 is adjacent to a sensor inlet port A (the right-hand position of the end surface shown in FIG. 4) of the member 36. Also the coupling optical system 21 according to this embodiment is formed by a structure made of a magnetic material, such as nickel, iron, ferrite or invar (here, invar is used). Also the magnetic field in the coupling optical system 21 is made to be smaller because of the magnetic shield effect of the coupling optical system 21.

FIG. 5 is a diagram showing the structure of the reflection end 32 of the sensor 30 shown in FIG. 3. As shown in FIG. 5, the reflection end 32 of the sensor 30 is, similar to the incidental/emission end 33, secured by a ferrule 37. The leading end of the ferrule 37 is spherically ground to stabilize the amount of reflected light. A reflecting mirror 38 for reflecting light is disposed in such a manner that the reflecting mirror 38 is in contact with the leading end of the ferrule 37. Although the typical reflecting mirror 38 is a single mirror, it is possible to grind the leading end of ferrule 34 like a plane and coat a reflecting film thereon. Reference numeral 35b shown in FIG. 5 represents an optical path in the ferrule 37.

As described above, the reflection end 32 of the sensor 30 secured by the ferrule 37, the ferrule 37 and the reflecting mirror 38 are included in a structure 39 made of a magnetic material, such as nickel, iron, ferrite or invar. The magnetic field in the structure 39 to which the sensor 30 is exposed is reduced because of the magnetic shielding effect of the ferrule 37. As a result, the substantial end position of the reflection end 32 of the sensor 30 is adjacent to a sensor inlet port C (the right-hand position of the end surface shown in FIG. 5) of the structure 39.

As described above, this embodiment has the above-mentioned structure in which the sensor 30 comprising the optical fiber is employed instead of the sensor comprising a lead glass block and the sensor 30 is arranged to form a substantial closed loop around the conductor 2. Therefore, a structure which cannot easily be affected by an external magnetic field generated by an external electric current or the like can be formed in accordance with the Ampere's theorem. Thus, accurate measurement can always be performed. Since the optical fiber is employed, the size of the structure including the sensor can be reduced and the structure can be simplified as compared with the structure comprising the lead glass block. Therefore, the cost can be reduced.

Effects and features of this embodiment will now be described.

The sensor 30 comprising the optical fiber is wound around the conductor 2 by the number n of turns. When viewed in a plane perpendicular to the conductor 2, the perspective angle Ω obtained by viewing a region (the two end regions of the optical fiber) between the substantial end position A of the incidental/emission end 33 of the sensor 30 and the substantial end position C of the reflection end 32 is made to be not more than 1% of the 2 πn (radian). Therefore, the dimensions of the two end regions of the optical fiber, which can easily be affected by an external magnetic field, with respect to the conductor 2 can satisfactorily be reduced. As a result, the influence of an external magnetic field generated by an external electric current or the like can be prevented. Since an electric current, which is to be measured, can be measured by 99% or more, accurate measurement can be performed. The value of 1% is the allowance of the rated value of an electric current in the optical current transformer for measuring an electric current.

Specifically, to make the perspective angle Ω of the two end regions of the optical fiber when viewed from the conductor 2 to be not more than 1% of 2 πn (radian), the perspective angle Ω of the two end regions of the optical fiber when viewed from the conductor 2 is required to be 0.25 radian (14.3 degrees) if the number n of turns of the sensor 30 is 4. If the number n of turns of the sensor 30 is 1, the perspective angle Ω of the two end regions of the optical fiber from the conductor 2 is required to be 0.0625 radian (3.6 degrees).

Further this embodiment has the structure in which the incidental end and the emission end of the sensor 30 are made to coincide with each other to form the incidental/emission end 33. The other end is formed into the reflection end 32. As a result, light is propagated in the same optical path to be given the Faraday effect (nonreciprocal effect) in both the forward propagation and reverse propagation. Therefore, the sensitivity of the sensor 30 can be doubled. Since the sensor 30 is wound around the conductor 2, the incidental/emission end 33 and the reflection end 32 can easily be disposed adjacent to each other. Thus, the sensor 30 can easily be formed into the closed loop. As a result, an influence from an external magnetic field generated by an external electric current or the like can be prevented.

Since the incidental/emission end 33 and the reflection end 32 of the sensor 30 are respectively secured by the ferrules 34 and 37, the end of the sensor 30 can be secured without enlargement of the birefringence in the end of the sensor 30. If the birefringence is locally enlarged, the influence of the external magnetic field becomes irregular. Thus, an error can easily be committed. Since the birefringence can be made to be uniform and small over the sensor 30 in this embodiment, the influence of an external magnetic field generated by an external electric current or the like can be prevented. Therefore, the electric current which flows in the conductor 2 can accurately be measured.

Since the reflection end 32 of the sensor 30 is secured by the ferrule 37, the position of the reflection end 32 can easily be fixed. As a result, the sensor 30 can easily be formed into the closed loop. As a result, an influence of an external magnetic field generated by an external electric current or the like can be prevented. The reflecting mirror 38 serving as a reflecting member is disposed to be in contact with the ferrule 37 for securing the reflection end 32. Therefore, light can easily be reflected and the reflection point of light in the sensor 30 can easily be specified. Thus, the sensor 30 can easily be formed into the closed loop.

Since the ferrule 37 for securing the reflection end 32 and the reflecting mirror 38 are included in the same structure 39, the position, at which light is reflected, can be fixed. Thus, the intensity of reflected light can be stabilized and the accuracy of the optical current transformer can be maintained satisfactorily. Therefore, the structure of the reflection end 32 of the sensor 30 can always be maintained in addition to the effect obtainable from use of the ferrule 37. Thus, the position of the reflection end 32 of the sensor 30 can easily be specified. Also from this viewpoint, the sensor 30 can easily be formed into the closed loop.

Since the incidental/emission end 33 and the reflection end 32 of the sensor 30 are respectively included in the members 36 and 39 each of which is made of a magnetic material, such as nickel, iron, ferrite or invar, the magnetic shielding effect of the members 36 and 39 enables the sensor 30 to easily be formed into the closed loop. As a result, an influence of an external magnetic field generated by an external electric current or the like can be prevented.

As described above, the positions of the end surfaces at the two ends of the sensor 30 are made to be adjacent to the sensor inlet ports A and C of the members 36 and 39. The reason why the expression as "adjacent" is employed is that the distribution of the magnetic field is changed by an adjacent magnetic member. In this embodiment, the positions of the sensor inlet ports A and C of the members 36 and 39 are, for convenience, made to be the substantial two ends of the sensor 30. The region between the positions A and C is made to be the two end regions of the optical fiber when the above-mentioned perspective angle is defined.

Other embodiments of the optical current transformer according to the present invention will be described. The same portions as those of the first embodiment will be indicated in the same reference numerals and their detailed description will be omitted.

Second Embodiment

Since a second embodiment has a basic structure which is the same as that according to the first embodiment, only portions different from the first embodiment will now be described with reference to FIGS. 4 and 5.

Although the incidental/emission end 33 of the sensor 30 secured by the ferrule 34 and the ferrule 34 are included in the member 36 made of a magnetic material according to the first embodiment shown in FIG. 4, the member 36 is made of a non-magnetic material in place of the magnetic material according to the second embodiment. Similarly to the first embodiment, the coupling optical system 21 is made of a magnetic material, such as nickel, iron, ferrite or invar. Thus, the magnetic field in the coupling optical system 21 is reduced because of the magnetic shielding effect. As a result, the incidental/emission end 33 of the optical fiber for forming the sensor 30 is exposed to the magnetic field to the leading end B of the ferrule 34.

Although the reflection end 32 of the sensor 30 secured by the ferrule 37, the ferrule 37 and the reflecting mirror 38 are included in the structure 39 according to the first embodiment shown in FIG. 5, the structure 39 is made of a non-magnetic material in place of the magnetic material according to the second embodiment. As a result, the reflection end 32 of the optical fiber for forming the sensor 30 is exposed to the magnetic field to the leading end D of the ferrule 37.

The other portions are the same as those according to the first embodiment.

In the second embodiment having the above-mentioned structure, the substantial two ends of the sensor 30 are B and D. The region between the positions B and D is made to be two end regions of the optical fiber, and the perspective angle is defined similarly to the first embodiment. Thus, a closed loop structure can be formed. Therefore, also this embodiment is able to prevent an influence of an external magnetic field generated because of an external electric current or the like, similarly to the first embodiment. According to the second embodiment, the substantial end surfaces of the sensor 30 are B and D, as shown in FIG. 3. Therefore, the perspective angle of the two end regions viewed from the conductor 2 can be made to be smaller than that realized in the first embodiment. Thus, the further precise closed loop can be realized.

The same effect can be obtained even if one of the members 36 and 39 is a magnetic member and the other is a nonmagnetic member. For example, if the member 36 is a magnetic member and the member 37 is a nonmagnetic member, the substantial end surfaces thereof are A and D.

Further, if the magnetic shield covers the ferrules 34 and 37 to a mid-portion (between A and B or C and D) of the ferrules 34 and 37, the mid-portion may be the substantial end surface of the optical fiber.

Third Embodiment

Figures 6A, 6B:
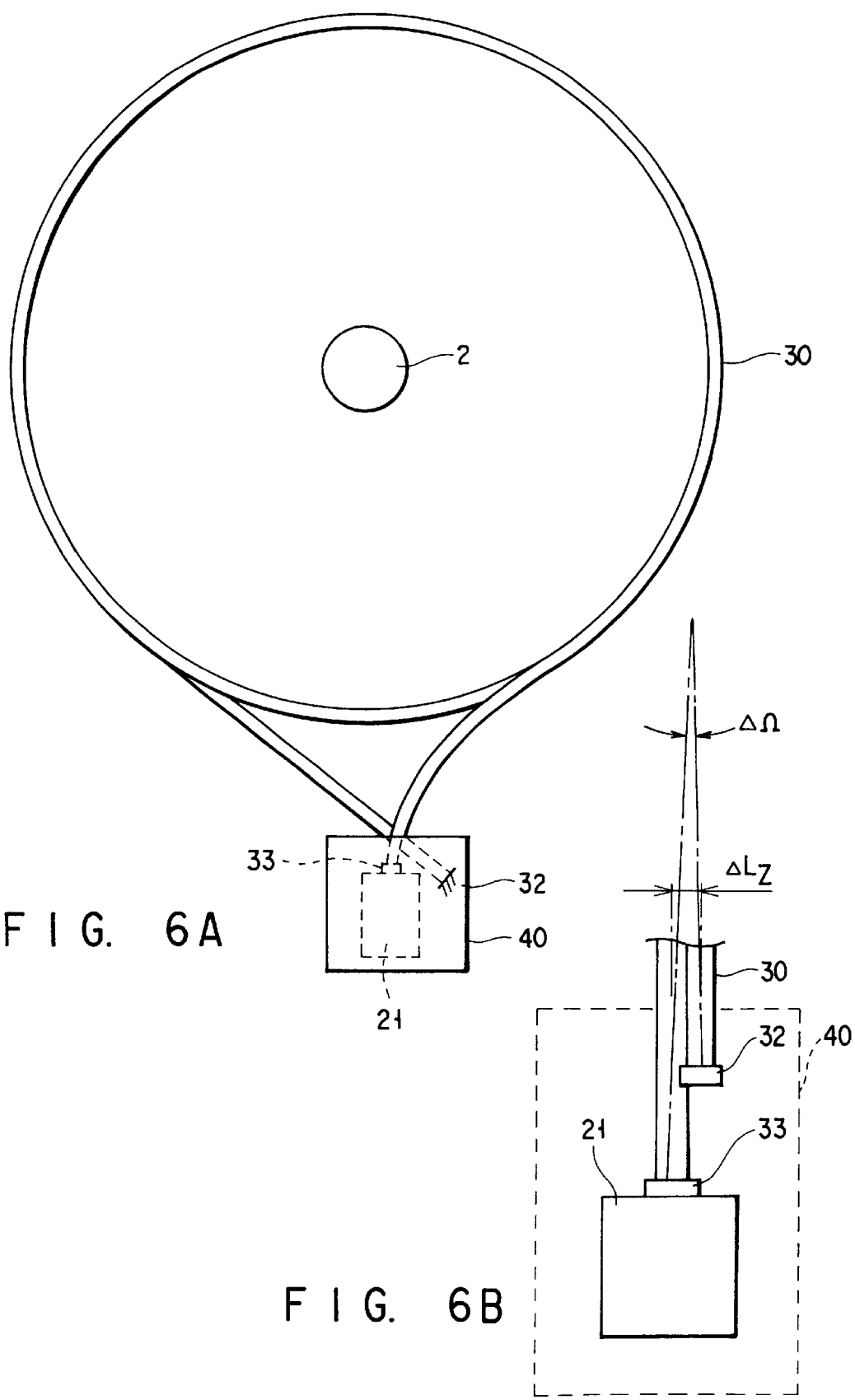
FIG. 6A is a diagram showing the positional relationship between a sensor and a coupling optical system according to a third embodiment.
FIG. 6B is a side view of FIG. 6A.

FIG. 6A is a diagram showing the connection between the sensor 30 and the coupling optical system 21 in the optical current transformer according to the third embodiment. FIG. 6B is a side view of FIG. 6A to illustrate overlapping of the optical fiber 30.

Since the optical current transformer according to this embodiment has the basic structure similar to that according to the first embodiment, only the portions different from the first embodiment will now be described with reference to FIGS. 6A and 6B.

As shown in FIG. 6A, the incidental/emission end 33 and the reflection end 32 of the sensor 30 wound around the conductor 2 are included in one member 40 made of a magnetic material, such as nickel, iron, ferrite or invar. The magnetic field in the member 40 is reduced because of its magnetic shield effect. In this embodiment, the two ends of the sensor 30 are disposed adjacently in such a way that the two ends are almost in contact with each other in a direction in parallel to the conductor 2, as shown in FIG. 6B. That is, a portion including the coupling optical system 21 and a portion including the reflection end 32 of the sensor 30 are disposed to overlap in such a manner that the distance $\Delta Lz$ between the centers of the over-lapping portions can be made to be significantly reduced. The degree of overlap of the sensor 30 is determined in such a way that the perspective angle $\Delta \Omega$ obtained by viewing the region between the portion including the coupling optical system 21 and the portion including the reflection end 32 from a certain point of the conductor 2 is not more than 1% of $2\pi n$ (radian). The other portions are similar to those according to the first embodiment.

Since the two ends of the sensor 30 comprising the optical fiber are included in one member 40, the two ends of the sensor 30 can easily be secured. Thus, the positional relationship between the two ends of the sensor 30 can be maintained as desired. Since the member 40 is made of the magnetic material, the obtained magnetic shield effect enables the magnetic field in a redundant portion (portions forward than the intersection of the optical fibers shown in FIG. 6A) over the closed loop to be reduced. As a result, an influence of the magnetic field in the redundant portion can be prevented. Thus, the sensor 30 can easily be formed into the closed loop. Since the two ends of the optical fiber are disposed adjacently in a direction in which the electric current flows in the conductor which is to be measured, an influence of an external electric current having a directional component perpendicular to the direction in which the electric current which flows in the conductor which is to be measured or an electric current flowing through a conductor which bent at 90 degrees can be prevented. Therefore, precise measurement can be performed.

A modification of this embodiment in which the two ends of the sensor 30 are not included in one member 40 may be employed in which the foregoing two ends are included in individual members. Moreover, the overall body of the two end regions of the optical fiber including the two members are covered with a magnetic shielding material. Also in this case, the operation and effect obtainable from this embodiment can be obtained.

Figure 7:
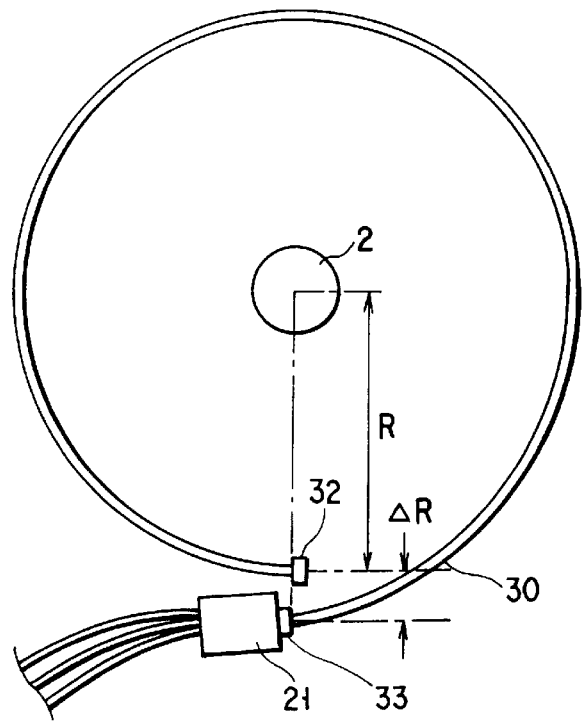
FIG. 7 is a diagram showing the shape of a sensor according to a modification of the third embodiment.

FIG. 7 is a diagram showing the connection between the sensor 30 and the coupling optical system 21 of the optical current transformer according to the modification of the third embodiment. As shown in FIG. 6A, the third embodiment is structured such that the closed loop is formed by intersecting the portion including the reflection end of the optical fiber and the portion including the incidental/emission end. In the modification shown in FIG. 7, the closed loop is formed by disposing the reflection end 32 and the incidental/emission end 33 of the sensor 30 on one straight line in such a manner that the two ends are disposed at different positions in the radial direction. The modification shown in FIG. 7 can have an effect similar to a complete closed loop configuration, though there is a little influence of an external current. In order to make equal the magnetic fields at both ends of the optical fiber, it is desirable to set $\Delta R/R \leq 0.1$. Further, in this case, it is necessary to set the perspective angle $\Delta \Omega$ obtained by viewing the region between two end regions from the conductor 2 not more than 1% of $2\pi n$ (radian).

Fourth Embodiment

Figure 8:
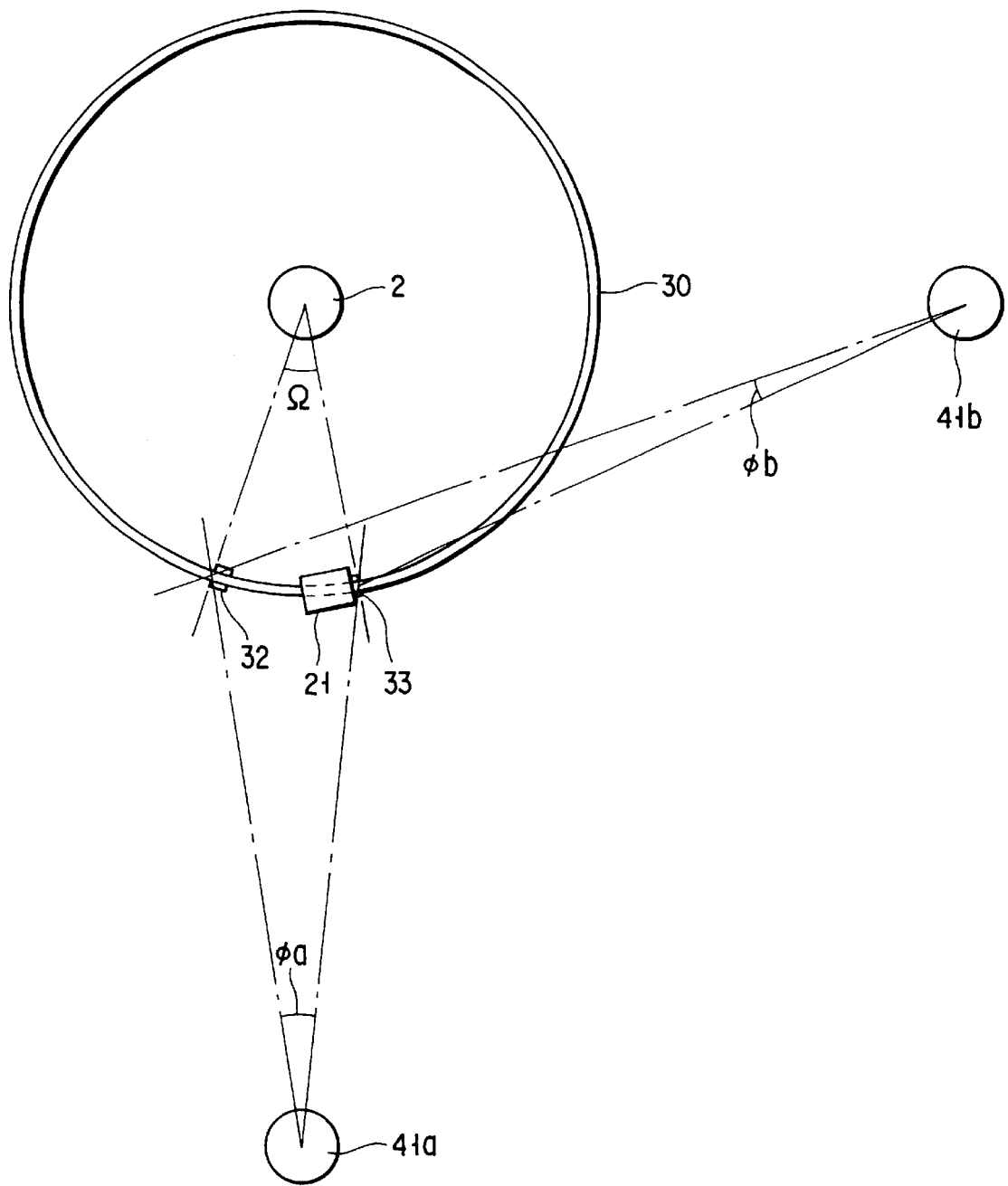
FIG. 8 is a diagram showing the positional relationship between a sensor and a coupling optical system according to a fourth embodiment.

FIG. 8 is a diagram showing the connection between the sensor 30 and the coupling optical system 21 of the optical current transformer according to a fourth embodiment of the present invention. This embodiment is characterized by the location of the two end regions of the optical fiber forming the sensor 30 in which an external conductor is disposed adjacent to the conductor 2 which is to be measured. Since the optical current transformer according to this embodiment has the basic structure similar to that according to the first embodiment, only the characteristics difference from those of the first embodiment will now be described with reference to FIG. 8.

As shown in FIG. 8, the sensor 30 comprising the optical fiber is wound around the conductor 2 by number n of turns which is substantially an integer not smaller than 1. External conductors 41a and 41b are disposed on the outside of the sensor 30. The external conductor may be a conductor for a sheath current flowing through a tank, conductors in other phases in the case of a conductor of three phases is separated into three conductors which are included in the respective tanks, or conductors in other phases in the case of conductors of three phases are included in the same tank. The sensor 30 is structured in such a manner that the perspective angles $\phi a$ and $\phi b$ obtained when the two end regions of the sensor 30 are viewed from the external conductors 41a and 41b are not more than 1% of $2\pi n$ (radian). The other portions are formed similarly to those according to the first embodiment. That is, the perspective angle $\Omega$ obtained when the two end regions of the optical fiber forming the sensor 30 are viewed from the conductor 2 which is to be measured is not more than 1% of $2\pi n$ (radian).

If electric currents respectively flow in the conductor 2 and the external conductor 41a (or 41b) are $I_1$ and $I_2$, the Farady rotational angle $\theta$ which is given by the sensor 30 is the sum of the Farady rotational angles $\theta_1$ and $\theta_2$ generated by the respective electric currents as follows:

$$\theta = \theta_1 + \theta_2 = nVI_1 + (\phi a/2\pi)VI_2 \tag{5}$$

where n is the number of turns of the sensor 30 around the conductor which is to be measured and $\phi a$ (or $\phi b$) is the perspective angle obtained by viewing the two end regions of the sensor 30 from the external conductor 41a (or 41b). The second term in the right side of the equation (5) is an error occurring due to the external conductor 41a (or 41b). The degree of the error can be obtained by dividing the second term in the right side by the first term in the right side. To make the error to be not more than ±1%, the following condition must be satisfied:

$$|\{(\phi a/2\ \pi)VI_2\}/nVI_1|=|\{(\phi a/2\ \pi n)(I_2/I_1)\}|\leq 1\% \qquad (6)$$

If $|I_1|=|I_2|$, the condition (6) represents the condition that the perspective angle is not more than 1% of $2\pi n$ (radian).

According to this embodiment having the above-mentioned structure, the dimensions of the two end regions of the optical fiber which can easily be affected by external electric currents which flow in the external conductors 41a and 41b can sufficiently be reduced with respect to the external conductors 41a and 41b. Therefore, the influence of the external electric current can be prevented and therefore accurate measurement can be performed.

The external conductor 41a of the two external conductors 41a and 41b is disposed such that the two end regions of the optical fiber exist on a line connecting the conductor 2 and the external conductor 41a. The other external conductor 41b is disposed such that the two end regions of the optical fiber do not exist on a line connecting the conductor 2 and the external conductor 41b. Since the external conductor 41b enables the perspective angle of the two end regions of the optical fiber to be reduced in this case, it is preferable that the position of the external conductor 41b be selected as compared with the position of the external conductor 41a if one external conductor is disposed with respect to the conductor 2 and the position of the external conductor can be selected if the distance between the conductor 2 and the conductor 41b equals the distance between the conductor 2 and the conductor 41.

Fifth Embodiment

Figure 9:
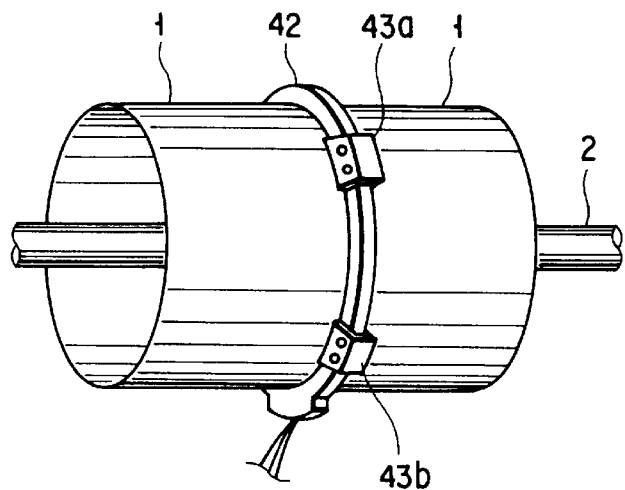
FIG. 9 is a diagram showing the overall structure of a tank according to a fifth embodiment.
Figure 10:
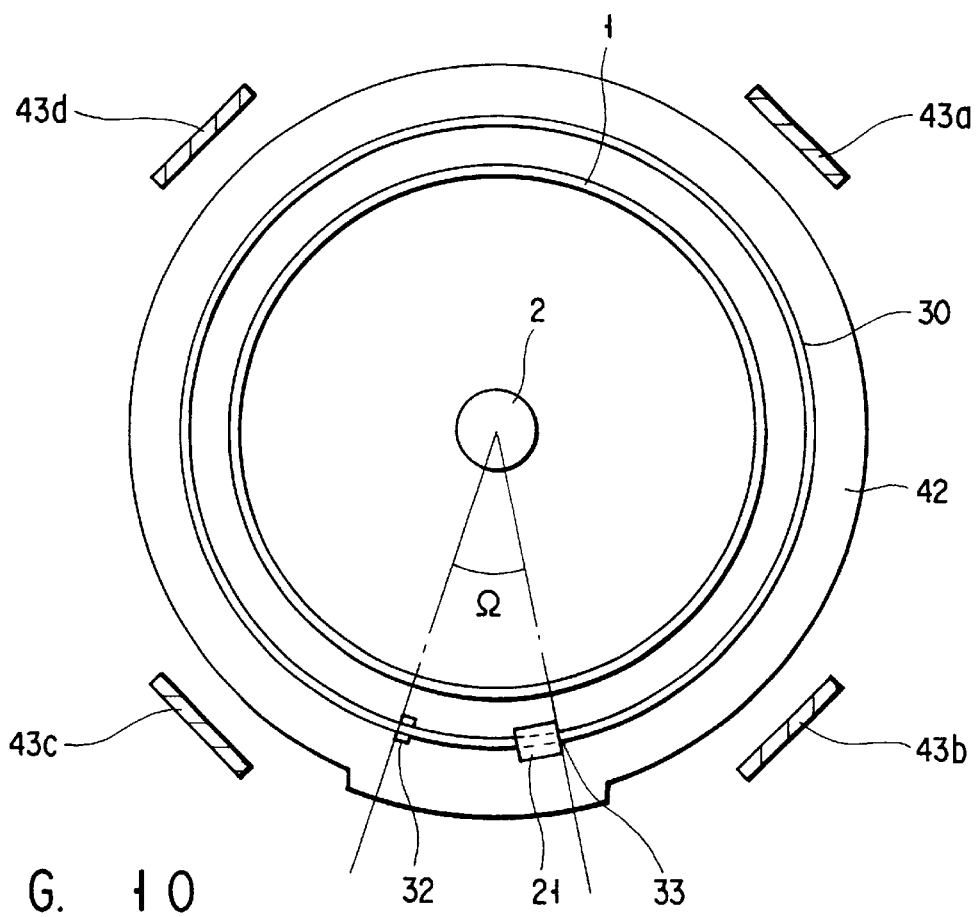
FIG. 10 is a diagram showing the positional relationship between a sensor and a coupling optical system according to the fifth embodiment.

FIG. 9 and 10 respectively are a schematic perspective view and a cross sectional view showing a fifth embodiment of the present invention. This embodiment is characterized by the positions of the two end regions of the optical fiber forming the sensor 30 when plural sheath current paths 43a to 43d which flow on the outside of the sensor 30 are formed in a tank 1 which includes the conductor 2. Since the optical current transformer according to this embodiment has a structure similar to that according to the first embodiment, only portions different from the first embodiment will now be described with reference to FIGS. 9 and 10.

As shown in FIG. 10, the sensor 30 comprising the optical fiber, its reflection end 32, its incidental/emission end 33 and the coupling optical system 21 are included in a sensor receiving section 42, the sensor 30 being wound around the conductor 2 by the number n of turns which substantially an integer not smaller than 1. The sensor receiving section 42 also serves as a relay flange, the sensor receiving section 42 being disposed at the position of a junction of the tanks 1. In this case, a sheath electric current, which flows on the tanks 1, is arranged to flow through four shunt bars 43a to 43d disposed at the same intervals on the outer surface of the sensor receiving section 42. That is, the shunt bars 43a to 43d form plural sheath electric current paths which flow on the outside of the sensor 30. Thus, no electric current path exists between the conductor 2 and the sensor 30. In this embodiment, the two end regions of the optical fiber forming the sensor 30 are disposed between two adjacent shunt bars (for example, between the shunt bars 43b and 43c), as shown in FIG. 10. The other portions are similar to those according to the first embodiment.

The two end regions of the optical fiber forming the sensor 30 are disposed between the two adjacent shunt bars 43b and 43c enables the perspective angle obtained by viewing the two end regions of the optical fiber from each sheath electric current path formed by the foregoing shunt bars 43b and 43c to be reduced. As a result, the dimensions of the two end regions of the optical fiber, which can easily be affected by an external electric current, with respect to the sheath electric current paths can sufficiently be reduced. Thus, an influence of the sheath electric current can be prevented. As a result, accurate measurement can be performed.

Sixth Embodiment

FIG. 11 is a diagram showing an optical current transformer according to a sixth embodiment of the present invention. This embodiment is characterized by the location of the two end regions of the optical fiber of each of sensors 30a to 30c in a case where the sensors 30a to 30c are disposed to correspond to plural conductors 2a to 2c (a three-phase AC structure is illustrated here) included in one tank 1. Since the optical current transformer according to this embodiment has a structure similar to that according to the first embodiment, only portions different from those according to the first embodiment will now be described with reference to FIG. 11.

As shown in FIG. 11, this embodiment is structured in such a manner that the plural conductors 2a to 2c for a three-phase AC included in one tank 1 are provided with corresponding optical current transformers 44a to 44c comprising the sensors 30a to 30c, coupling optical systems 21a to 21c connected to the incidental/emission ends of the sensors 30a to 30c, and reflection ends 32a to 32c. The optical current transformers 44a to 44c have corresponding feed-through connectors 45a to 45c, 46a to 46c and 47a to 47c for introducing the light transmitting fibers and light receiving fibers to the outside of the tank 1. As an alternative to the feed-through connectors, the light transmission fiber and the light receiving fiber may be allowed to directly penetrate the tank 1 to form a sealed structure. The end regions 48a to 48c of the corresponding sensors 30a to 30c of the optical current transformers 44a to 44c are disposed adjacent to the wall of the tank 1 to face the wall of the tank 1. The other portions are similar to those according to the first embodiment.

Since this embodiment has the optical current transformers 44a to 44c which are provided for the corresponding plural conductors 2a to 2c in one tank 1, the quantity of the electric current in each of the conductors 2a to 2c can accurately be measured. Since the feed-through connectors 45a to 45c, 46a to 46c and 47a to 47c prevent deterioration in the output occurring attributable to the penetration of the tank 1 and thus establish the satisfactory connection of the light transmission fiber and the light receiving fiber, accurate measurement can be performed.

Since this embodiment has the structure such that the end regions 48a to 48c of the corresponding sensors 30a to 30c are disposed adjacent to the wall of the tank 1 to face the wall of the tank 1, the distance from an external conductor except for the conductor, to each of the end regions 48a to 48c is elongated. Therefore, the perspective angle from the external conductor can be reduced. As a result, the dimensions of the end regions 48a to 48c of the optical fiber, which can easily be affected by an external electric current, with respect to the external conductor can sufficiently be reduced. Since the influence of the external electric current can be prevented, accurate measurement can be performed. Since the coupling optical systems 21a to 21c are disposed adjacent to the wall of the tank 1, transmission and receipt of light to and from the outside of the tank 1 can easily be performed through the feed-through connectors 45a to 45c, 46a to 46c and 47a to 47c. Therefore, the structure of the light transmission portion from the coupling optical systems 21a to 21c to a signal detection circuit formed on the outside of the tank 1 can be shortened and simplified. As a result, the overall structure of the optical current transformer can be simplified.

Seventh Embodiment

FIGS. 12, 13A and 13B are diagrams showing an optical current transformer according to a seventh embodiment of the present invention. FIG. 12 is a schematic view showing the structure of the sensor 30. FIGS. 13A and 13B are cross sectional views showing different examples taken along line A–A' shown in FIG. 12. This embodiment is characterized by a structure for magnetically shielding the sensor 30 in a case where an external conductor is disposed adjacent to the conductor 2. Since the optical current transformer according to this embodiment has the basic structure similar to that according to the first embodiment, only portions different from the first embodiment will now be described with reference to FIGS. 12, 13A and 13B.

As shown in FIG. 12, the sensor 30 comprising the optical fiber is wound around the conductor 2 by one turn. An external conductor 41c is disposed on the outside of the sensor 30. The rotational angle of the polarization plane corresponding to the intensity of the magnetic field is detected to measure the value of the electric current. The rotational angle is not larger than 45° and a preferred rotational angle is 30° or smaller in view of maintaining the accuracy in the calculations performed by an electronic circuit. Since an intense magnetic field is formed in the case of a large electric current, the sensitivity of the sensor must be lowered. To most easily lower the sensitivity of the sensor, it might be considered feasible to magnetically shield the sensor. If no external magnetic field exists, an arbitrary portion of the sensor can be simply shielded if necessary. If an external conductor exist, its influence must be considered. That is, the magnetic shield must be performed uniformly when viewed from plural external conductors.

Therefore, plural members 49 each of which is made of a magnetic material, such as nickel, iron, ferrite or invar, and which have the same size are disposed apart from one another at the same intervals to cover the sensor 30. As a result, the magnetic field in portions which are covered with the members 49 is reduced because of the magnetic shielding effect. Specifically, the members 49 are disposed in such a manner that the ratio of the portions shielded by the members 49 and non-shielded portions around which no member 49 is disposed is made to be constant (1:1 in the case of FIG. 12) if the sensor 30 is viewed from the any external conductor. Though not shown in FIG. 12, many external conductors may be located around the conductor 2. Due to the members 49 disposed as described above, the integrated value of the magnetic field along a region S and that along a region T have the same absolute value but have the opposite polarity.

The fact that the magnetic shield is able to lower the apparent sensitivity to enable a large electric current to be measured will now be described by using equations.

Assuming that the Verdet constant of the optical fiber forming the sensor is V, a short length along the optical fiber is dl, n is the number of turns of the fiber, and the intensity of the magnetic field is H, the Farady rotational angle θ with respect to the electric current I which is to be measured is expressed by the following Equation (7):

$$\theta = V \cdot n \int_{L_s}^{L_f} H \cdot dl \tag{7}$$

Ls and Lf in Equation (7) respectively indicate the two ends of the optical fiber. If a completely closed loop is formed, Ls and Lf coincide with each other and thus a rotary integral corresponding to the number n of turns of the optical fiber is calculated.

Assuming that the magnetic field intensity H in the region from L2 to L3 is made to be zero by the magnetic shield, the Farady rotational angle θs with respect to the electric current, which is the same as that expressed in Equation (7) and which is to be measured, is expressed by the following Equation (8):

$$\theta s = V \cdot n \int_{L_s}^{L_2} H \cdot dl + \int_{L_2}^{L_f} H \cdot dl \tag{8}$$

$$< \theta$$

As can be understood from condition (8), if the magnetic shield makes the magnetic field intensity H in the region from L2 to L3 to be zero, it is possible to reduce the Farady rotational angle and thus to lower the apparent sensitivity of the sensor. In this case, the magnetic field intensity H is not always required to be zero by the magnetic shield. If the relationship |HS|<|H| is satisfied, a similar effect can be obtained. Moreover, plural regions can magnetically be shielded.

The member 49 is typically formed in such a manner that it covers the overall body of the sensor 30, as shown in FIG. 13A. As an alternative to this, the member 49 may have a shape including an insulating member 50 in a portion in the circumferential direction thereof, as shown in FIG. 13B. This structure attains an effect of preventing an eddy current loss occurring if an intense magnetic field is formed. Although each of the cross sections of the members 49 shown in FIGS. 13A and 13B has a square outer shape, the shape is not limited to this. A member 49 having a circular outer shape may be employed. Note that the other portions are formed similarly to those according to the first embodiment.

This embodiment having the above-mentioned structure is able to reduce the result of the integration along the optical path of the magnetic field which can be sensed by the sensor 30 by the degree corresponding to the portions which are magnetically shielded by the member 49. Therefore, the Farady rotational angle can be reduced to a required value (which is usually not more than 45° and a preferred Farady rotational angle is not more than 30° in view of the accuracy of the calculations which are performed by an electronic circuit). As a result, even a large electric current can accurately be measured.

The sensor 30 according to this embodiment is structured in such a manner that the ratio of the portions shielded by the plural members 49 and the portions which are not shielded by the members 49 is made to be constant when the sensor 30 is viewed from any of the plural external conductors.

As a result of this structure, the absolute values of the results of integration of the magnetic field along the optical path which are sensed in the region S which are easily affected by the external conductor 41c and the residual region T can be made to be the same and their polarities are made to be opposite. As a result, the influence of the external conductor 41c can be prevented. Thus, accurate measurement can be performed.

The magnetic shield structure for the sensor 30 may arbitrarily be changed as modifications of this embodiment. As an alternative to the embodiment in which the members 49 each of which is made of the magnetic material, the sensor 30 may be periodically and uniformly coated with a magnetic material to obtain the similar effect. The overall body of the sensor 30 may be covered with a mesh made of a magnetic material to obtain the similar effect. When the fineness of the mesh is changed, the effect of the magnetic shield can be changed. The similar effect can be obtained by surrounding the optical fiber with a gel including magnetic powders. A magnetic material may be partially and uniformly mixed with the clad layer or the coating layer of the fiber. Moreover, the external coating for the fiber may be partially and uniformly be coated with a magnetic material. As an alternative to this, the fiber may be allowed to pass through a pipe or a cylindrical member partially coated with a magnetic material to attain the similar effect.

If no external conductor exists, it is possible to continuously cover a portion of the sensor 30 with a magnetic material to easily lower the sensitivity of the sensor 30. When the right-hand half portion of the sensor 30 shown in FIG. 12 is covered with a magnetic material, the sensitivity of the sensor 30 can be substantially halved. A method capable of effectively preventing the influence of the external magnetic field may be a method in which a magnetic structure, a coating or a mesh having a proper length in the direction of the conductor is disposed on the outside of the sensor 30. The foregoing plural types of the magnetic shielding members may be combined arbitrarily to attain the foregoing effect.

The magnetic shielding material to magnetically shield the sensor 30 may be an alloy of nickel, iron and ferrite as well as nickel, iron, ferrite or invar. Depending upon the frequency for the measurement, the magnetic shielding effect can be obtained by using a good conductor (aluminum, copper or the like) in place of the magnetic material.

Since this embodiment is characterized in that the optical elements including the optical fiber are magnetically shielded, the other detailed members may arbitrarily be selected. An example in which the structure of this embodiment is applied to a sagnac type interference optical current transformer will now be described. The interference optical current transformer is an optical current transformer which uses a Faraday effect obtainable from a Faraday device disposed at a position which is affected by a magnetic field induced by an electric current which is to be measured so as to measure the level of an electric current in accordance with the difference in the phase between two light waves which propagate through the Faraday device.

Figure 14:
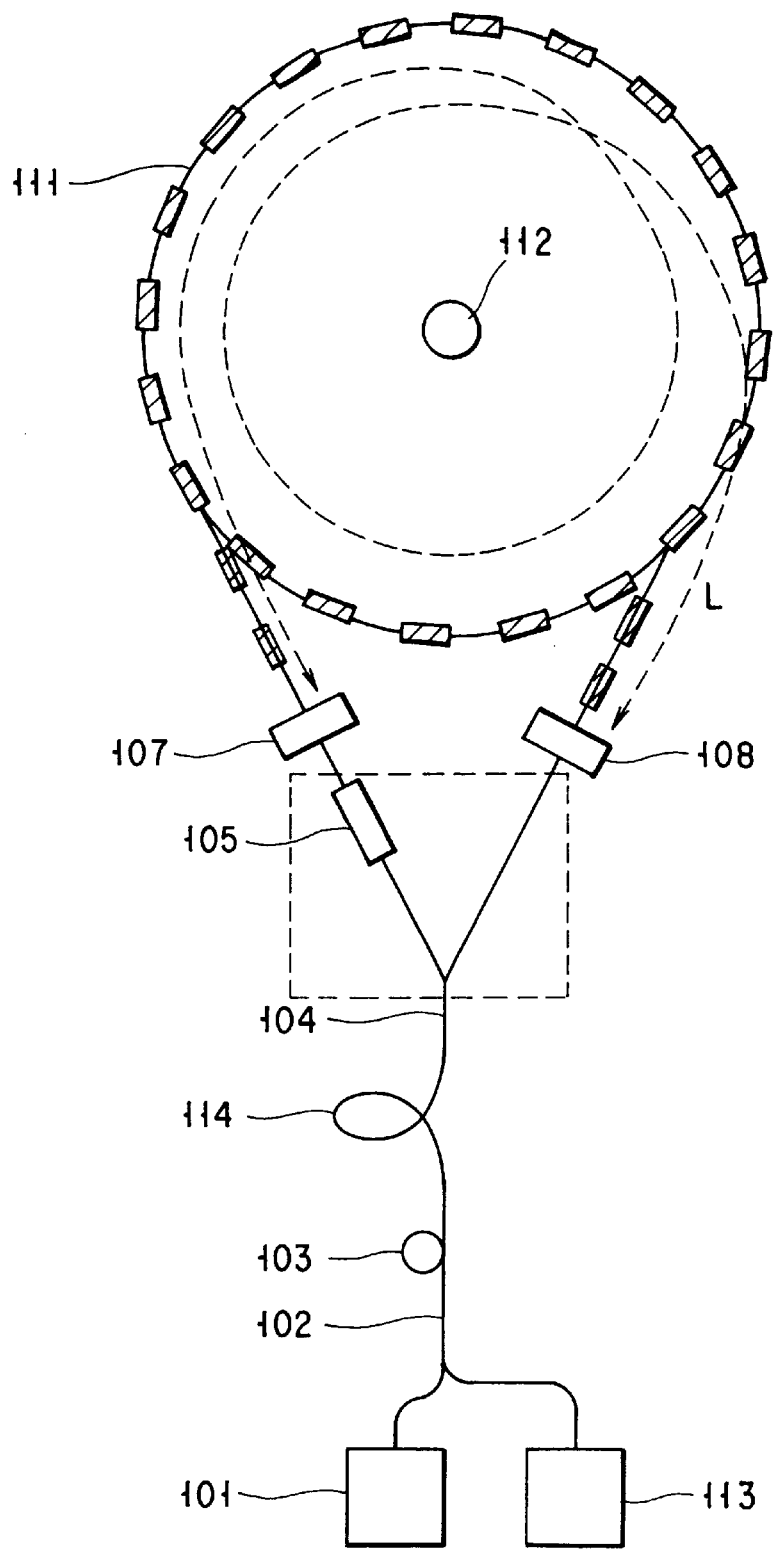
FIG. 14 is a diagram showing an interference optical current transformer according to a modification of the seventh embodiment.

FIG. 14 is a diagram showing one example of the schematic structure of the Sagnac type sensor. Light emitted from a laser diode (or superluminescent diode) 101 is introduced into a fiber coupler 102. Then, light from the fiber coupler 102 is transmitted through a fiber type polarizer 103 having a polarizing function allowed to have by winding a high birefringence fiber so as to be formed into linearly polarized light. The linearly polarized light is formed into a single transverse mode by a mode filter 114 comprising a single-mode fiber, and then divided into two portions by a fiber coupler 104.

The waveform of one of the two portions of light is modulated by a phase modulator 105 having a function of modulating the phase by changing the refractive index of light in a wave guide on $LiNbO_3$ by using a Pockels effect. The modulated light is formed into circularly polarized light by a $\lambda/4$-wavelength plate 107 having a function of shifting the phase of light in one direction by $\lambda/4$ from another light realized by winding a fiber. Then, circularly polarized light is allowed to pass through a fiber 111 wound around a conductor 112 through which an electric current which is to be measured, and then again converted into linearly polarized light by a $\lambda/4$-wavelength plate 108. Then, linearly polarized light is incident on the fiber coupler 104. The fiber 111 is, as shown in FIG. 12, periodically and uniformly applied with a partial magnetic shield.

On the other hand, another light divided by the fiber coupler 104 is formed into circularly polarized light by a $\lambda/4$-wavelength plate 108, and then allowed to pass through the fiber 111 which is a Faraday device wound around a conductor 112. Then, the light is again formed into linearly polarized light by the $\lambda/4$-wavelength plate 107, and then the waveform of light is modulated by the phase modulator 105, and then coupled with light propagating in the opposite direction by the fiber coupler 104.

Light coupled as described above is allowed to pass through the mode filter 114 and the polarizer 103. Then, only the polarized mode is incident on the fiber 111 is extracted, and then separated by the fiber coupler 102 followed by making incident light on a signal processing system 113 which calculates the electric current by determining the phase difference between two light waves by linking with the modulation frequency of the phase modulator 105.

The fiber 111 is a single mode fiber, by one or more turns, wound around the conductor 112, through which an electric current which is to be measured flows, the single mode fiber being twisted.

The relationship of magnetic field H generated by an electric current which is to be measured and the phase difference $\phi$ in the Sagnac interference system is expressed by the following equation:

$$\phi = 2VHL \quad (9)$$

where V is a Verdet constant and L is the length of the Faraday device (optical fiber).

When the fiber 111, by one or more turns, wound around the conductor 112, through which electric current I which is to be measured flows, is employed as the Faraday device, the following relationship is held when the ends of the fiber 111 are closed because of the Ampere's rule:

$$HL = nI \quad (10)$$

where n is the number of turns of the fiber 111.

Therefore, the foregoing Equation (9) is expressed as follows:

$$\phi = 2VnI \quad (11)$$

Thus, the intensity of the electric current which flows in a region surrounded by the fiber 111 is detected as the phase difference between the two optical paths.

In this case, the $\lambda/4$-wavelength plates 107 and 108 are the fiber ends. Therefore, it is necessary to locate these plates 107 and 108 close to each other. In order to closely locate these plates 107 and 108, they can be contained in the magnetic shield member 40, as shown in FIG. 6A.

As described above, the present invention has the following characteristics and effects.

The two ends of the optical fiber are disposed with respect to the conductor which is to be measured as follows. The two ends of the optical fiber are disposed in such a manner that assuming that the number of turns of the optical fiber around the conductor is n, the perspective angle obtained by viewing a region between the two ends of the optical fiber from the conductor is not more than 1% of 2 $\pi$n (radian) when the optical fiber is projected to a plane perpendicular to the conductor.

Therefore, the dimensions of the two end regions of the optical fiber which can easily be affected by an external magnetic field with respect to the conductor can sufficiently be reduced. Thus, an influence of an external magnetic field generated attributable to an external electric current or the like can be prevented. Since an electric current can be measured by about 99% or more, accurate measurement can be performed.

The present invention is also characterized in that the two ends of the optical fiber are included in one structure.

Therefore, the two ends of the optical fiber forming the sensor can easily be secured so that the relationship between the positions of the two ends is maintained. Thus, a preferred closed loop structure capable of preventing an influence of an external magnetic field generated attributable to an external electric current or the like can easily be realized.

In a case where an external conductor is disposed on the outside of the optical fiber adjacent to a conductor which is to be measured, the present invention is also characterized by the following location of the two ends of the optical fiber with respect to the external conductor: that is, the two ends of the optical fiber are disposed in such a manner that assuming that the number of turns of the optical fiber around the conductor is n, the perspective angle obtained by viewing a region between the two ends of the optical fiber from the external conductor is not more than 1% of 2 $\pi$n (radian) when the optical fiber is projected to a plane perpendicular to the external conductor.

Therefore, the dimensions of the two end regions of the optical fiber which can easily be affected by an external electric current with respect to the external conductor can sufficiently be reduced. Therefore, an influence of an external electric current which flows through the external conductor can be prevented. Thus, accurate measurement can be performed.

In the case where the conductor is included in the tank and plural sheath electric current paths flowing on the outside of the optical fiber are formed in the tank, the present invention is also characterized in that the region between the two ends of the optical fiber is disposed between two adjacent sheath electric current paths.

Therefore, the perspective angle obtained by viewing the two end regions from the sheath electric current paths can be reduced so that the dimensions of the two end regions of the optical fiber which can easily be affected by an external electric current with respect to the sheath electric current paths are sufficiently reduced. As a result, the influence of the sheath electric currents flowing in the sheath electric current paths can be prevented so that accurate measurement is performed.

In the case where plural conductors included in one tank are the conductors which are to be measured and the optical fiber is provided for each of the conductors, the present invention is also characterized in that the two ends of each of the optical fibers are disposed adjacent to the wall of the tank to face the wall of the tank.

Therefore, the dimensions of the two end regions of the optical fiber which can easily be affected by an external electric current with respect to the external conductor can sufficiently be reduced. Thus, the influence of an external electric current which flows in the external conductor except for the conductor can be prevented. As a result, accurate measurement can be performed. Since the coupling optical system is disposed adjacent to the wall of the tank, the structure of the light propagation portion penetrating the wall of the tank can be shortened and simplified.

The present invention is also characterized in that the two ends of the optical fiber are disposed in such a manner that the two ends substantially overlap in a direction in parallel to the conductor.

Therefore, the influence of an external magnetic field generated by an external electric current having a directional component perpendicular to the direction in which an electric current flows in the conductor which is to be measured can be prevented. As a result, accurate measurement can be performed.

The present invention is also characterized in that the optical elements are covered with the material which attains the magnetic shielding effect. That is, a portion of the optical elements including the optical fiber and the coupling optical system is covered with the magnetic shielding material capable of attaining the magnetic shielding effect.

Therefore, the magnetic field in the optical element in the above-mentioned portion can be reduced. Thus, the influence of generation of an undesirable Faraday effect in a portion of the optical elements can be prevented. As a result, accurate measurement can be performed.

The present invention is also characterized in that the optical fiber is covered with the magnetic shielding material.

Therefore, the magnetic field in the optical fiber can be reduced and thus the apparent sensitivity can be lowered. Thus, a large electric current can be measured.

In a case where a plural external magnetic fields exist adjacent to a conductor which is to be measured, the present invention is also characterized in that plural magnetic shielding material members are disposed apart from one another in the lengthwise direction of the optical fiber. Moreover, the ratio of the shielded portions covered with the magnetic shielding material members and non-shielded portions which are not covered with the magnetic shielding material members is always constant when viewed from any of the external magnetic fields.

As a result, the influence of the external magnetic field can be prevented and the sensitivity of the optical fiber can be lowered. Thus, a large electric current can be measured and accurate measurement can be performed.

Although the invention has been described in its preferred form with a certain degree of particularity, it is understood that the present disclosure of the preferred form can be changed in the details of construction and in the combination and arrangement of parts without departing from the spirit and the scope of the invention.

Although according to the above-mentioned embodiments, the magnetic shield member is made of the magnetic material, it is not limited to a single magnetic material. It is possible to use a nonmagnetic material coated with a magnetic material. The magnetic shield material may be an alloy of nickel, iron, ferrite, or invar, as well as nickel, iron, ferrite, or invar. It is possible to use a material except for the magnetic material.

Although the foregoing embodiments have been described about the sensor having a reflection end and formed such that the incidental end and the emission end coincide with each other, the present invention may be applied to a sensor having n o reflection end and formed such that the incidental end and the emission end are different from each other. In this case, a similarly excellent effect can be obtained. One example of this modification in which the first embodiment is modified is shown in FIG. 15. In this example, the beam splitter 24a of FIG. 2 is omitted and a lens 22b' is added. The lens 22b is connected to an incidental end 62 and the lens 22b' is connected to an emission end 64.

Although the incidental end 62 and the emission end 64 are included in the same member 21, it is possible to place them in respective members.

Although the foregoing embodiments have been described to be executed solely, some embodiments may be combined with each other. That is, the optical fiber according to any one of the first to sixth embodiments may be provided with the magnetic shield according to the seventh embodiment shown in FIG. 12.

What is claimed is:

1. An optical current transformer, comprising:

a light source for generating a polarized measuring light;

an optical fiber wound n times around a conductor through which an electric current to be measured flows and arranged to circulate the polarized measuring light emitted from said light source around the conductor, a polarization plane of the polarized measuring light being rotated by a magnetic field generated by the electric current; and means for measuring the electric current by detecting an angle of rotation of the polarization plane of the polarized measuring light which transmits through said optical fiber, wherein said optical fiber has an incidental end connected to said light source and an emission end connected to said detecting means, and the incidental end and the emission end are arranged in such a manner that an angle obtained by viewing the two ends from the conductor is not more than 1% of 2 πn radian wherein n is an integer less than or equal to 4 and said incidental end and said emission end are disposed in one member made of a magnetic material.

2. An optical current transformer according to claim 1, wherein said incidental end and said emission end respectively are included in individual members.

3. An optical current transformer according to claim 2, wherein said individual members are made of a magnetic material.

4. An optical current transformer according to claim 1, wherein said incidental end and said emission end are disposed in such a manner that an angle obtained by viewing the two ends from an external conductor is not more than 1% of 2 πn radian notwithstanding an electric current generated by the external conductor.

5. An optical current transformer, comprising:

a light source for generating a polarized measuring light;

an optical fiber wound n times around a conductor through which an electric current to be measured flows and arranged to circulate the polarized measuring light emitted from said light source around the conductor, a polarization plane of the polarized measuring light being rotated by a magnetic field generated by the electric current; and means for detecting the electric current by detecting an angle of rotation of the polarization plane of the polarized measuring light which propagates through said optical fiber, wherein said optical fiber has an incidental end connected to said light source and an emission end connected to said detecting means, and the incidental end and the emission end are arranged in such a manner that an angle obtained by viewing the two ends from the conductor is not more than 1% of 2 πn radian wherein n is an integer less than or equal to 4, said incidental end and said emission end are disposed in one member made of a magnetic material, and said optical fiber is magnetically shielded in such a manner that regions magnetically shielded and regions which are not magnetically shielded are periodically and alternately disposed, and a ratio of the regions magnetically shielded to the regions which are not magnetically shielded is constant when viewed from any of a plurality of external conductors.

6. An optical current transformer according to claim 1, wherein said incidental end and said emission end are disposed between any adjacent two of a plurality of sheath electric current paths when the conductor is included in a tank having a ground potential and the plurality of sheath electric current paths.

7. An optical current transformer according to claim 1, wherein said incidental end and said emission end are arranged to face a wall of a tank when a plurality of conductors, through which electric currents to be measured flow, are included in the tank having a ground potential, and a plurality of optical fibers are wound around the plurality of conductors.

8. An optical current transformer according to claim 1, wherein said incidental end and said emission end are arranged on substantially the same radius and are in contact with each other.

9. An optical current transformer according to claim 1, wherein said incidental end and said emission end are arranged on substantially the same radius and are separated from each other in a radial direction.

10. An optical current transformer according to claim 1, wherein said optical fiber and said light source are connected to each other through a first coupling optical system and said optical fiber and said detection means are connected to each other through a second coupling optical system, and said first and second coupling optical systems are included in a housing which is magnetically shielded.

11. An optical current transformer according to claim 10, wherein said housing is a magnetic material member.

12. An optical current transformer, comprising:

a light source for generating a polarized measuring light;

an optical fiber wound n times around a conductor through which an electric current to be measured flows and arranged to circulate the polarized measuring light emitted from said light source around the conductor, a polarization plane of the polarized measuring light being rotated by a magnetic field generated by the electric current; and means for detecting the electric current by measuring an angle of rotation of the polarization plane of the polarized measuring light which transmits through said optical fiber, wherein said optical fiber has a reflection end and an incidental/emission end connected to said light source and arranged to receive the polarized measuring light and to emit the polarized measuring light reflected by the reflection end, and the incidental/emission end and the reflection end are arranged in such a manner that an angle obtained by viewing the two ends from the conductor is not more than 1% of 2 πn radian wherein n is an integer less than or equal to 4 and said reflection end and said incidental/emission end are disposed in one member made of a magnetic material.

13. An optical current transformer according to claim 12, wherein said reflection end and said incidental/emission end respectively are included in individual members.

14. An optical current transformer according to claim 13, wherein said individual members are made of a magnetic material.

15. An optical current transformer according to claim 12, wherein said reflection end and said incidental/emission end are disposed in such a manner that an angle obtained by viewing the two ends from an external conductor is not more than 1% of $2\pi n$ radian notwithstanding an electric current generated by the external conductor.

16. An optical current transformer, comprising:

a light source for generating a polarized measuring light;

an optical fiber wound n times around a conductor through which an electric current to be measured flows and arranged to circulate the polarized measuring light emitted from said light source around the conductor, a polarization plane of the polarized measuring light being rotated by a magnetic field generated by the electric current; and means for measuring the electric current by detecting an angle of rotation of the polarization plane of the polarized measuring light which transmits through said optical fiber, wherein said optical fiber has a reflection end and an incidental/emission end connected to said light source and arranged to receive the polarized measuring light and to emit the polarized measuring light reflected by the reflection end, and the incidental/emission end and the reflection end are arranged in such a manner that an angle obtained by viewing the two ends from the conductor is not more than 1% of $2\pi n$ radian wherein n is an integer less than or equal to 4, said reflection end and said incidental/emission end are disposed in one member made of a magnetic material, and said optical fiber is magnetically shielded in such a manner that regions magnetically shielded and regions which are not magnetically shielded are periodically and alternately disposed, and a ratio of the regions magnetically shielded to the regions which are not magnetically shielded is constant when viewed from any of a plurality of external conductors.

17. An optical current transformer according to claim 12, wherein said reflection end and said incidental/emission end are disposed between any adjacent two of a plurality of sheath electric current paths when the conductor is included in a tank having a ground potential and the plurality of sheath electric current paths.

18. An optical current transformer according to claim 12, wherein said reflection end and said incidental/emission end are arranged to face a wall of a tank when a plurality of conductors, through which electric currents to be measured flow, are included in the tank having a ground potential, and a plurality of optical fibers are wound around the plurality of conductors.

19. An optical current transformer according to claim 12, wherein said reflection end and said incidental/emission end are arranged on substantially the same radius and are in contact with each other.

20. An optical current transformer, comprising:

a light source for generating a polarized measuring light;

an optical fiber wound n times around a conductor through which an electric current to be measured flows and arranged to circulate the polarized measuring light emitted from said light source around the conductor, a polarization plane of the polarized measuring light being rotated by a magnetic field generated by the electric current; and means for detecting the electric current by measuring an angle of rotation of the polarization plane of the polarized measuring light which transmits through said optical fiber, wherein said optical fiber has a reflection end and an incidental/emission end connected to said light source and arranged to receive the polarized measuring light and to emit the polarized measuring light reflected by the reflection end, and the incidental/emission end and the reflection end are arranged in such a manner that an angle obtained by viewing the two ends from the conductor is not more than 1% of $2\pi n$ radian wherein n is an integer less than or equal to 4, said reflection end and said incidental/emission end are disposed in one member made of a magnetic material, and said reflection end and said incidental/emission end are arranged on substantially the same radius and are separated from each other in a radial direction.

21. An optical current transformer according to claim 12, wherein said optical fiber and said light source are connected to each other through a first coupling optical system and said optical fiber and said detecting means are connected to each other through a second coupling optical system, and said first and second coupling optical systems are included in a housing which is magnetically shielded.

22. An optical current transformer according to claim 21, wherein said coupling optical system is included in a magnetic material member.

23. An optical current transformer according to any one of claims 1–3, 4–14, or 15–22.

24. An optical current transformer according to claim 23, wherein said optical fiber is magnetically shielded by plural magnetic shielding members arranged uniformly apart from each other, and each of said magnetic shielding members is made of a magnetic member having an insulating member in a portion thereof.

25. An optical current transformer according to any one of claims 1–3, 4–14, or 15–22, wherein said optical fiber is magnetically shielded by a plurality of magnetic shielding members arranged in such a manner that a ratio of shielded portions to non-shielded portions is constant when viewed from any of a plurality of external conductors.

26. An optical current transformer according to claim 25, wherein said magnetic shielding member is made of a magnetic material having an insulating member in a portion thereof.

27. An optical current transformer according to any one of claims 1–3, 4–14, or 15–22, wherein said optical fiber is magnetically shielded by a mesh magnetic shielding member.

28. An optical current transformer according to any one of claims 1–3, 4–14, or 15–22, wherein a magnetic material is dispersively mixed into a layer selected from the group consisting of a clad layer, a coating layer and an external coating layer of said optical fiber.

29. An optical current transformer for measuring electric current, comprising:

a light source configured to generate a polarized measuring light;

an optical fiber wound n times around a conductor through which the electric current flows, configured to circulate the polarized measuring light emitted from said light source around the conductor, and including an incidental end and an emission end;

detectors configured to detect the polarized measuring light and to convert the polarized measuring light into electric signals corresponding to the intensity of the polarized measuring light; and a signal processor configured to process the electric signals in order to measure the electric current, wherein said incidental end of said optical fiber is connected to said light source and said emission end of said optical fiber is connected to said detectors, and said incidental end and said emission end are arranged such that the two ends are not separated around said conductor by more than one percent of 2 πn radian wherein n is an integer less than or equal to 4 and said incidental end and said emission end are disposed in one member made of a magnetic material.

30. An optical current transformer for measuring electric current, comprising:

a light source configured to generate a polarized measuring light;

an optical fiber wound n times around a conductor through which the electric current flows, configured to circulate the polarized measuring light emitted from said light source around the conductor, and comprising,
a reflection end configured to reflect the polarized measuring light, and
an incidental/emission end connected to said light source and configured to receive said polarized measuring light and to emit said polarized measuring light reflected by said reflection end;

detectors configured to detect the polarized measuring light and to convert the polarized measuring light into electric signals corresponding to the intensity of the polarized measuring light; and a signal processor configured to process the electric signals in order to measure the electric current, wherein said incidental/emission end and said reflection end of said optical fiber are arranged such that the two ends are not separated around said conductor by more than one percent of 2 πn radian wherein n is an integer less than or equal to 4 and said reflection end and said incidental/emission end are disposed in one member made of a magnetic material.

31. An optical current transformer comprising:

a light source for generating a polarized measuring light;

an optical fiber wound n times around a conductor through which an electric current to be measured flows and arranged to circulate the polarized measuring light emitted from said light source around the conductor, a polarization plane of the polarized measuring light being rotated by a magnetic field generated by the electric current; and means for detecting the electric current by detecting an angle of rotation of the polarization plane of the polarized measuring light which propagates thorough said optical fiber, wherein said optical fiber has an incidental end connected to said light source and an emission end connected to said detecting means, and the incidental end and the emission end are arranged on a straight line in such a manner that the incidental end and the emission end are arranged at different positions in a radial direction, thereby an angle obtained by viewing the two ends from the conductor is not more than 1% of 2 πn wherein n is an integer less than or equal to 4.

32. An optical current transformer comprising:

light source for generating a polarized measuring a light, an optical fiber wound n times around a conductor through which an electric current to be measured flows and arranged to circulate the polarized measuring light emitted from said light source around the conductor, a polarization plane of the polarized measuring light being rotated by a magnetic field generated by the electric current; and means for detecting the electric current by detecting an angle of rotation of the polarization plane of the polarized measuring light which propagates through said optical fiber, wherein said optical fiber has a reflection end and on incidental/emission end connected to said light source and arranged to receive the polarized measuring light and to emit the polarized measuring light reflected by the reflection end, and the incidental/emission end and the reflection end are arranged on a straight line in such a manner that the incidental/emission end and the reflection end are arranged at different positions in a radial direction, thereby an angle obtained by viewing the two ends from the conductor is not more than 1% of 2 πn wherein n is an integer less than or equal to 4.

33. An optical current transformer according to claim 31, wherein said incidental end and said emission end respectively are included in individual members.

34. An optical current transformer according to claim 33, wherein said individual members are made of a magnetic material.

35. An optical current transformer according to claim 31, wherein said incidental end and said emission end are disposed in one member.

36. An optical current transformer according to claim 35, wherein said one member is made of a magnetic material.

37. An optical current transformer according to claim 31, wherein said incidental end and said emission end are disposed in such a manner that an angle obtained by viewing the two ends from an external conductor is not more than 1% of 2 πn radian not withstanding an electric current generated by the external conductor.

38. An optical current transformer according to claim 37, wherein said optical fiber is magnetically shielded in such a manner that regions magnetically shielded and regions which are not magnetically shielded are periodically and alternately disposed, and a ratio of the regions magnetically shielded to the regions which are not magnetically shielded is constant when viewed from any of a plurality of external conductors.

39. An optical current transformer according to claim 31, wherein said incidental end and said emission end are disposed between any adjacent two of a plurality of sheath electric current paths when the conductor is included in a tank having a ground potential and the plurality of sheath electric current paths.

40. An optical current transformer according to claim 31, wherein said incidental end and said emission end are arranged to face a wall of a tank when a plurality of conductors, through which electric currents to be measured flow, are included in the tank having a ground potential, and a plurality of optical fibers are wound around the plurality of conductors.

41. An optical current transformer according to claim 31, wherein said optical fiber and said light source are connected to each other through a first coupling optical system and said optical fiber and said detection means are connected to each other through a second coupling optical system, and said first and second coupling optical systems are included in a housing which is magnetically shielded.

42. An optical current transformer according to claim 41, wherein said housing is a magnetic material member.

43. An optical current transformer according to claim 32, wherein said incidental end and said emission end respectively are included in individual members.

44. An optical current transformer according to claim 43, wherein said individual members are made of a magnetic material.

45. An optical current transformer according to claim 32, wherein said incidental end and said emission end are disposed in one member.

46. An optical current transformer according to claim 45, wherein said one member is made of a magnetic material.

47. An optical current transformer according to claim 32, wherein said incidental end and said emission end are disposed in such a manner that an angle obtained by viewing the two ends from an external conductor is not more than 1% of $2\pi n$ radian not withstanding an electric current generated by the external conductor.

48. An optical current transformer according to claim 47, wherein said optical fiber is magnetically shielded in such a manner that regions magnetically shielded and regions which are not magnetically shielded are periodically and alternately disposed, and a ratio of the regions magnetically shielded to the regions which are not magnetically shielded is constant when viewed from any of a plurality of external conductors.

49. An optical current transformer according to claim 32, wherein said incidental end and said emission end are disposed between any adjacent two of a plurality of sheath electric current paths when the conductor is included in a tank having a ground potential and the plurality of sheath electric current paths.

50. An optical current transformer according to claim 32, wherein said incidental end and said emission end are arranged to face a wall of a tank when a plurality of conductors, through which electric currents to be measured flow, are included in the tank having a ground potential, and a plurality of optical fibers are wound around the plurality of conductors.

51. An optical current transformer according to claim 32, wherein said optical fiber and said light source are connected to each other through a first coupling optical system and said optical fiber and said detection means are connected to each other through a second coupling optical system, and said first and second coupling optical systems are included in a housing which is magnetically shielded.

52. An optical current transformer according to claim 51, wherein said housing is a magnetic material member.

53. An optical current transformer according to claim 5, wherein said incidental end and said emission end respectively are included in individual members.

54. An optical current transformer according to claim 53, wherein said individual members are made of a magnetic material.

55. An optical current transformer according to claim 5, wherein said incidental end and said emission end are disposed in one member.

56. An optical current transformer according to claim 55, wherein said one member is made of a magnetic material.

57. An optical current transformer according to claim 5, wherein said incidental end and said emission end are disposed between any adjacent two of a plurality of sheath electric current paths when the conductor is included in a tank having a ground potential and the plurality of sheath electric current paths.

58. An optical current transformer according to claim 5, wherein said incidental end and said emission end are arranged to face a wall of a tank when a plurality of conductors, through which electric currents to be measured flow, are included in the tank having a ground potential, and a plurality of optical fibers are wound around the plurality of conductors.

59. An optical current transformer according to claim 5, wherein said incidental end and said emission end are arranged on substantially the same radius and are in contact with each other.

60. An optical current transformer according to claim 5, wherein said incidental end and said emission end are arranged on substantially the same radius and are separated from each other in a radial direction.

61. An optical current transformer according to claim 5, wherein said optical fiber and said light source are connected to each other through a first coupling optical system and said optical fiber and said detection means are connected to each other through a second coupling optical system, and said first and second coupling optical systems are included in a housing which is magnetically shielded.

62. An optical current transformer according to claim 61, wherein said housing is a magnetic material member.

63. An optical current transformer according to claim 16, wherein said incidental end and said emission end respectively are included in individual members.

64. An optical current transformer according to claim 63, wherein said members are made of a magnetic material.

65. An optical current transformer according to claim 11, wherein said incidental end and said emission end are disposed in one member.

66. An optical current transformer according to claim 65, wherein said one member is made of a magnetic material.

67. An optical current transformer according to claim 16, wherein said incidental end and said emission end are disposed between any adjacent two of a plurality of sheath electric current paths when the conductor is included in a tank having a ground potential and the plurality of sheath electric current paths.

68. An optical current transformer according to claim 16, wherein said incidental end and said emission end are arranged to face a wall of a tank when a plurality of conductors, through which electric currents to be measured flow, are included in the tank having a ground potential, and a plurality of optical fibers are wound around the plurality of conductors.

69. An optical current transformer according to claim 16, wherein said incidental end and said emission end are arranged on substantially the same radius and are in contact with each other.

70. An optical current transformer according to claim 16, wherein said incidental end and said emission end are arranged on substantially the same radius and are separated from each other in a radial direction.

71. An optical current transformer according to claim 16, wherein said optical fiber and said light source are connected to each other through a first coupling optical system and said optical fiber and said detection means are connected to each other through a second coupling optical system, and said first and second coupling optical systems are included in a housing which is magnetically shielded.

72. An optical current transformer according to claim 71, wherein said housing is a magnetic material member.

* * * * *